US008305816B2

(12) United States Patent
Park et al.

(10) Patent No.: US 8,305,816 B2
(45) Date of Patent: Nov. 6, 2012

(54) METHOD OF CONTROLLING A MEMORY CELL OF NON-VOLATILE MEMORY DEVICE

(75) Inventors: Ki-tae Park, Seongnam-si (KR); Ki-nam Kim, Seoul (KR); Yeong-taek Lee, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 903 days.

(21) Appl. No.: 12/222,895

(22) Filed: Aug. 19, 2008

(65) Prior Publication Data
US 2009/0052243 A1 Feb. 26, 2009

(30) Foreign Application Priority Data

Aug. 20, 2007 (KR) .................. 10-2007-0083446

(51) Int. Cl.
*G11C 16/04* (2006.01)
(52) U.S. Cl. .......... 365/185.22; 365/185.03; 365/185.25
(58) Field of Classification Search ............. 365/185.22, 365/185.25, 185.03, 185.18, 185.05
See application file for complete search history.

(56) References Cited

U.S. PATENT DOCUMENTS

| 2006/0245261 A1* | 11/2006 | Morooka ................ 365/185.23 |
| 2006/0291291 A1* | 12/2006 | Hosono et al. ........... 365/185.22 |
| 2008/0094904 A1* | 4/2008 | Byeon ..................... 365/185.18 |

FOREIGN PATENT DOCUMENTS

| JP | 2002-279788 A | 9/2002 |
| KR | 10-2001-0092073 A | 10/2001 |
| KR | 10-2006-0070734 A | 6/2006 |

* cited by examiner

*Primary Examiner* — Alexander Sofocleous
*Assistant Examiner* — Hien Nguyen
(74) *Attorney, Agent, or Firm* — Lee & Morse

(57) ABSTRACT

A method of controlling data includes, with respect to non-volatile memory cells connected to bit lines corresponding to a first bit line group, first controlling data written to the non-volatile memory cells by varying a control voltage, and, with respect to non-volatile memory cells connected to bit lines corresponding to a second bit line group, second controlling data written to the non-volatile memory cells by varying a control voltage. The controlling may include reading or verifying. Before verification, the method may include writing data to the non-volatile memory cells.

21 Claims, 22 Drawing Sheets

METHOD OF CONTROLLING A MEMORY CELL OF NON-VOLATILE MEMORY DEVICE

BACKGROUND OF THE INVENTION

1. Field of the Invention

Embodiments relate to a method of controlling a memory cell of a non-volatile memory device.

2. Description of the Related Art

A non-volatile memory device can electrically erase and program data, and can retain the data even when not being supplied with power. A common example of the non-volatile memory device is a flash memory which stores data based on a charge storage. Each of memory cells of the flash memory is formed of a cell transistor including a control gate, a charge storage layer, a source, and a drain. The flash memory changes a data value written to the memory cell by adjusting the amount of charge of the charge storage layer. The cell transistor of the flash memory adjusts the amount of charge of the charge storage layer according to an Fowler-Nordheim (F-N) tunneling mechanism.

An erasing operation of the cell transistor is performed by applying a ground voltage to the control gate of the cell transistor, and by applying a high voltage, higher than a power voltage, to a semiconductor substrate (or, a bulk). According to such a bias condition for erasing, a strong electric field is formed between the charge storage layer and the bulk, due to a high voltage difference between the charge storage layer and the bulk. As a result, charges in the charge storage layer are emitted to the bulk due to an F-N tunneling effect. At this point, a threshold voltage of the erased cell transistor is lowered.

A programming operation of the cell transistor is performed by applying the high voltage, higher than the power voltage, to the control gate, and by applying the ground voltage to the drain and the bulk. According to such a bias condition for programming, the charges are injected into the charge storage layer of the cell transistor due to the F-N tunneling effect. Accordingly, the threshold voltage of the cell transistor is increased.

In an erase state, the threshold voltage of the cell transistor is a negative ($<0$) voltage, since charges exits the charge storage layer. In a program state, the threshold voltage of the cell transistor is a positive ($>0$) voltage, since charges are injected into the charge storage layer.

SUMMARY

Embodiments are therefor directed to method of controlling a memory cell of a non-volatile memory device, which substantially overcomes one or more of the disadvantages of the related art.

An embodiment may provide a method of controlling memory cell data having reduced programming time.

An embodiment may provide a method of controlling memory cell data having decreased coupling.

An embodiment may provide a method of verifying memory cell data so as to reduce a data verification time, and a method of reading the memory cell data.

At least one of the above and other advantages may be realized by providing a method of controlling non-volatile memory cell data, the method including, with respect to non-volatile memory cells connected to bit lines corresponding to a first bit line group, first controlling data written to the non-volatile memory cells by varying a control voltage, and with respect to non-volatile memory cells connected to bit lines corresponding to a second bit line group, second controlling data written to the non-volatile memory cells by varying a control voltage.

Second controlling may be performed after using all control voltages in first controlling.

First controlling and second controlling may include controlling data written to the non-volatile memory cells by gradually increasing the control voltage.

First controlling may include simultaneously controlling the non-volatile memory cells connected to the bit lines corresponding to the first bit line group. Second controlling may include simultaneously controlling the non-volatile memory cells connected to the bit lines corresponding to the second bit line group.

The first bit line group may include even bit lines and the second bit line group includes odd bit lines, or vice versa.

The method may include, before first controlling, first precharging first bit lines corresponding to the first bit line group and, before second controlling, second precharging second bit lines corresponding to the second bit line group.

The method may include, before first and second controllings, writing data to the non-volatile memory cells, wherein a programming voltage used in writing data is higher than control voltages used in first and second controllings.

Writing data may include simultaneously programming a plurality of the non-volatile memory cells connected to the same word line.

Writing data may include simultaneously programming each of the non-volatile memory cells connected to the bit lines corresponding to the first bit line group and the non-volatile memory cells connected to the bit lines corresponding to the second bit line group.

At least one of first controlling and second controlling may include supplying a develop current for reading data written to the non-volatile memory cells.

First controlling may include verifying data written to the non-volatile memory cells using a first verification voltage, with a word line set to the first verification voltage, the word line being connected to the non-volatile memory cells. Second controlling may include verifying data written to the non-volatile memory cells using a second verification voltage, with a word line set to the second verification voltage, the word line being connected to the non-volatile memory cells. The second verification voltage may be higher than the first verification voltage.

The non-volatile memory cell may be a multi-level flash memory cell in which n (n is a natural number greater than 2) bit data is stored.

The method may include dividing a plurality of bit lines into N (N is a natural number greater than 2) bit line groups, with respect to non-volatile memory cells connected to bit lines corresponding to an $i_{th}$ (i is the natural number greater than 2 and less than N−1) bit line group, $i_{th}$ controlling data written to the non-volatile memory cells by varying the control voltage, and with respect to non-volatile memory cells connected to bit lines corresponding to an $N_{th}$ bit line group, $N_{th}$ controlling data written to the non-volatile memory cells by varying the control voltage. The dividing may include assigning adjacent bit lines to different bit line groups.

The method may include, before first and second controllings, writing data to non volatile memory cells using a programming voltage. First controlling or second controlling may no longer be performed when controlling is finished with respect to all of the control voltages therein. Writing may include simultaneously programming each of the non-volatile memory cells connected to bit lines of the first bit line group and the non-volatile memory cells connected to bit lines of the second bit line group. The method may include, after second controlling, repeatedly performing writing, first controlling, and second controlling by gradually increasing the programming voltage. When there is a control voltage among the control voltages of first and second controllings that is no longer used during controlling, controlling using the control voltage that is no longer used in subsequent first and second controllings may not be performed.

First and second controllings are first and second verifyings, and the control voltage may be a verify voltage. First and second controllings may be first and second readings, and the control voltage may be a read voltage.

The method may include, before first and second controllings, first through $n_{th}$ writing data to non-volatile memory cells using first through $n_{th}$ (n is a natural number greater than 2) programming voltages. Each of first controlling and second controlling may include first through $n_{th}$ sub-controlling respectively controlling the first through $n_{th}$ programming based on the first through $n_{th}$ programming voltages. The method may include, after second controlling, repeatedly performing second through $n_{th}$ programming, first controlling, and second controlling by gradually increasing the second through $n_{th}$ programming voltages.

BRIEF DESCRIPTION OF THE DRAWINGS

The above and other features and advantages will become more apparent to those of ordinary skill in the art by describing in detail exemplary embodiments with reference to the attached drawings, in which.

DETAILED DESCRIPTION

Korean Patent Application No. 10-2007-0083446, filed on Aug. 20, 2007, in the Korean Intellectual Property Office, and entitled: "Method of Programming Memory Cell of Non-Volatile Memory Device," is incorporated by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

Figure 1A:
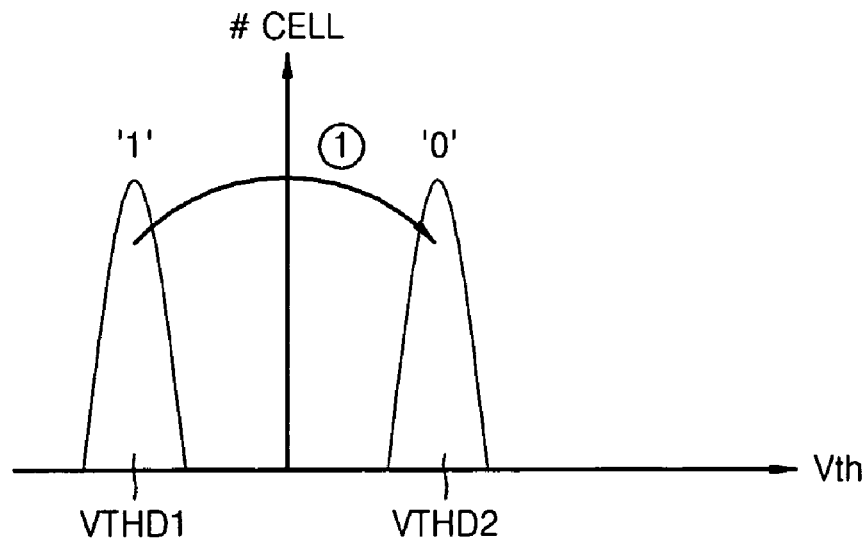
FIG. 1A illustrates an example in which 1 bit data is written using two threshold voltage distributions.

FIG. 1A illustrates an example in which 1 bit data is written using two threshold voltage distributions.

Referring to FIG. 1A, when a target write bit is 0, a threshold voltage of a non-volatile memory cell (hereinafter, the non-volatile memory cell is referred to as 'a memory cell') may be changed so as to correspond to a second threshold voltage distribution VTHD2 containing positive voltages. When the target write bit is 1, the threshold voltage of the memory cell may be maintained so as to correspond to a first threshold voltage distribution VTHD1 containing negative voltages.

Figure 1B:
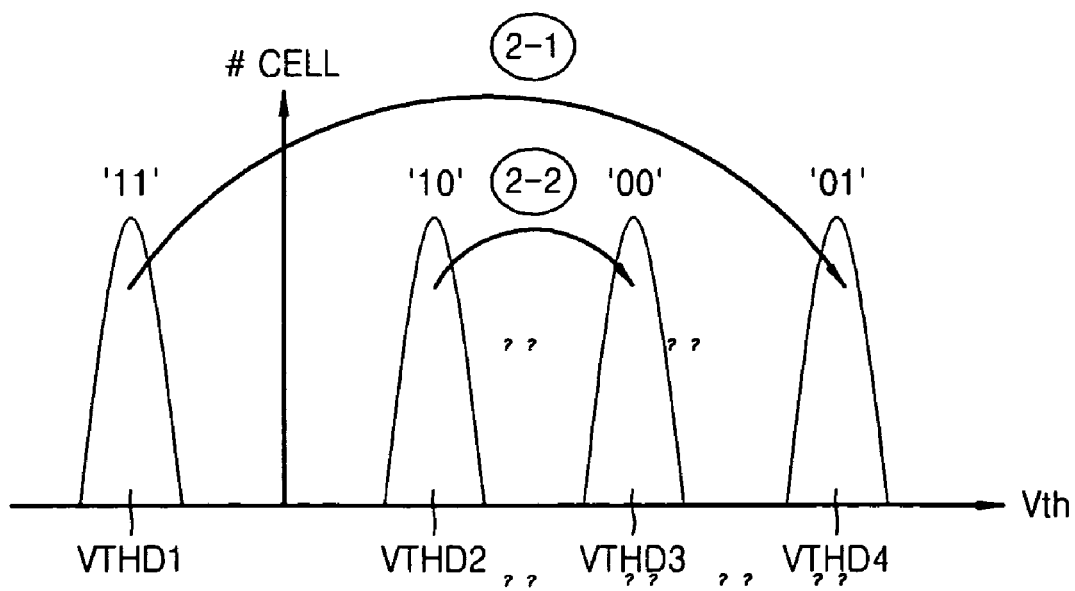
FIG. 1B illustrates a first example in which 2 bit data is written using four threshold voltage distributions.

FIG. 1B illustrates a first example in which 2 bit data is written by using four threshold voltage distributions.

Referring to FIG. 1B, a procedure as previously described with reference to FIG. 1A may be applied to a first bit write stage. According to a value of a first bit, the threshold voltage of the memory cell may be programmed so as to correspond to the first threshold voltage distribution VTHD1 or the second threshold voltage distribution VTHD2.

In a second bit write stage, when the first bit was 0, i.e., when the threshold voltage of the memory cell is programmed so as to correspond to the second threshold voltage distribution VTHD2 in the first bit write stage, if the second bit is 0, the threshold voltage of the memory cell may be programmed so as to correspond to a third threshold voltage distribution VTHD3 containing voltages higher than the second threshold voltage distribution VTHD2. Otherwise, if the second bit is 1, the threshold voltage of the memory cell may be programmed so as to correspond to the second threshold voltage distribution VTHD2. When the first bit was 1, i.e., when the threshold voltage of the memory cell is programmed so as to correspond to the first threshold voltage distribution VTHD1 in the first bit write stage, if the second bit is 0, the threshold voltage of the memory cell may be programmed so as to correspond to a fourth threshold voltage distribution VTHD4 containing voltages higher than the third threshold voltage distribution VTHD3. Otherwise, if the second bit is 1, the threshold voltage of the memory cell may be programmed so as to correspond to the first threshold voltage distribution VTHD1.

Figure 1C:
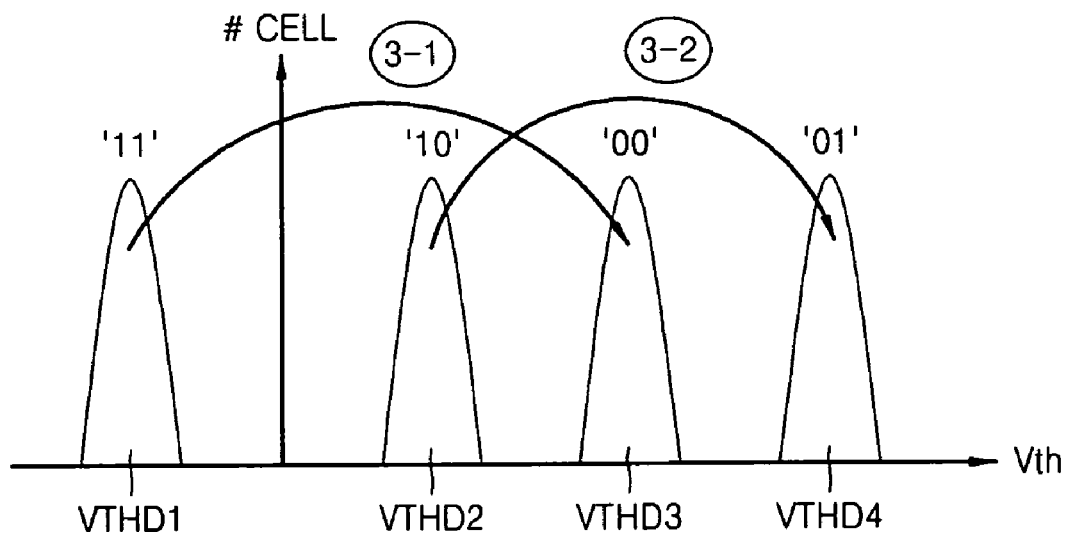
FIG. 1C illustrates a second example in which the 2 bit data is written using the four threshold voltage distributions.

FIG. 1C illustrates a second example in which the 2 bit data is written using the four threshold voltage distributions.

In the first example of FIG. 1B, in the second bit write stage, the threshold voltage of the memory cell may be programmed to be shifted between the first threshold voltage distribution VTHD1 and the fourth threshold voltage distribution VTHD4, or between the second threshold voltage distribution VTHD2 and the third threshold voltage distribution VTHD3. On the other hand, in the second example of FIG. 1C, in the second bit write stage, the threshold voltage of the memory cell may be programmed to be shifted between the first threshold voltage distribution VTHD1 and the third threshold voltage distribution VTHD3 or between the second threshold voltage distribution VTHD2 and the fourth threshold voltage distribution VTHD4.

Figure 2A:
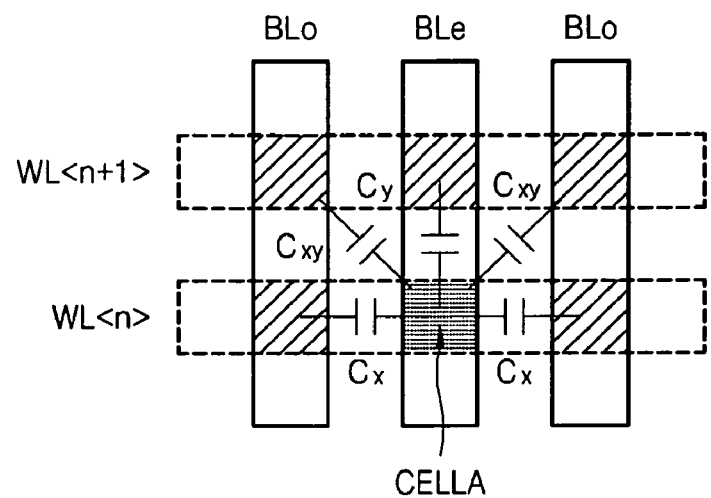
FIGS. 2A and 2B illustrate a case in which a threshold voltage of a memory cell, which has already been programmed, is shifted due to capacitive couplings existing between each of the adjacent word lines or between each of the adjacent bit lines, respectively.
Figure 2A:
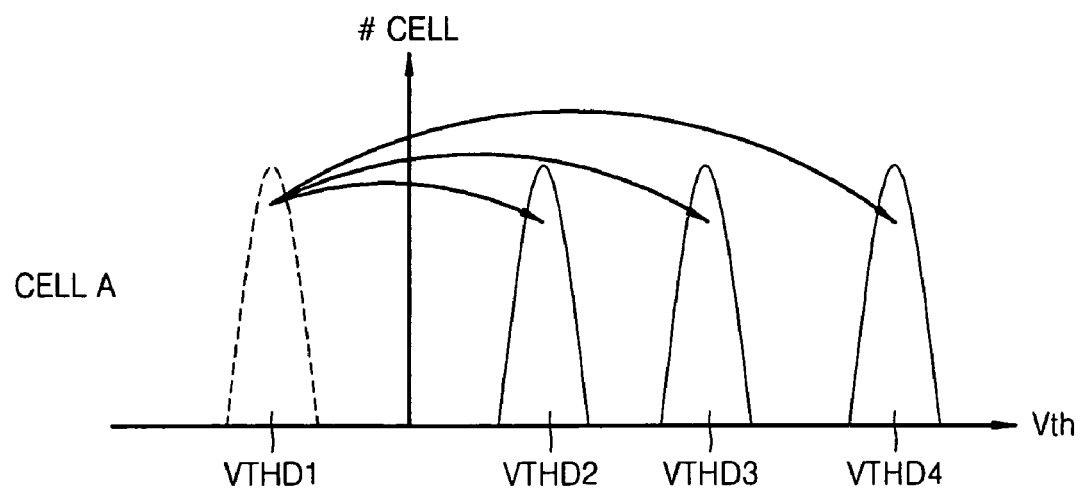

FIG. 2A illustrates a case in which a threshold voltage of a memory cell CELL A is programmed so as to correspond to a first threshold voltage distribution VTHD1, and then to correspond to one of a second threshold voltage distribution VTHD2, a third threshold voltage distribution VTHD3, and a fourth threshold voltage distribution VTHD4.

Figure 2B:
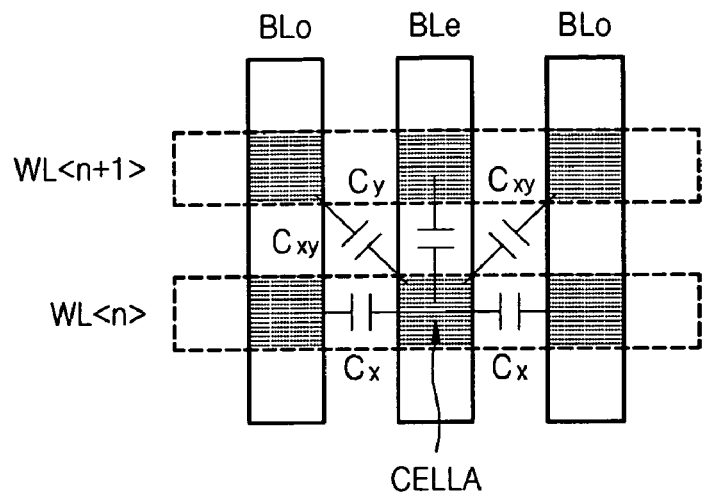
Figure 2B:
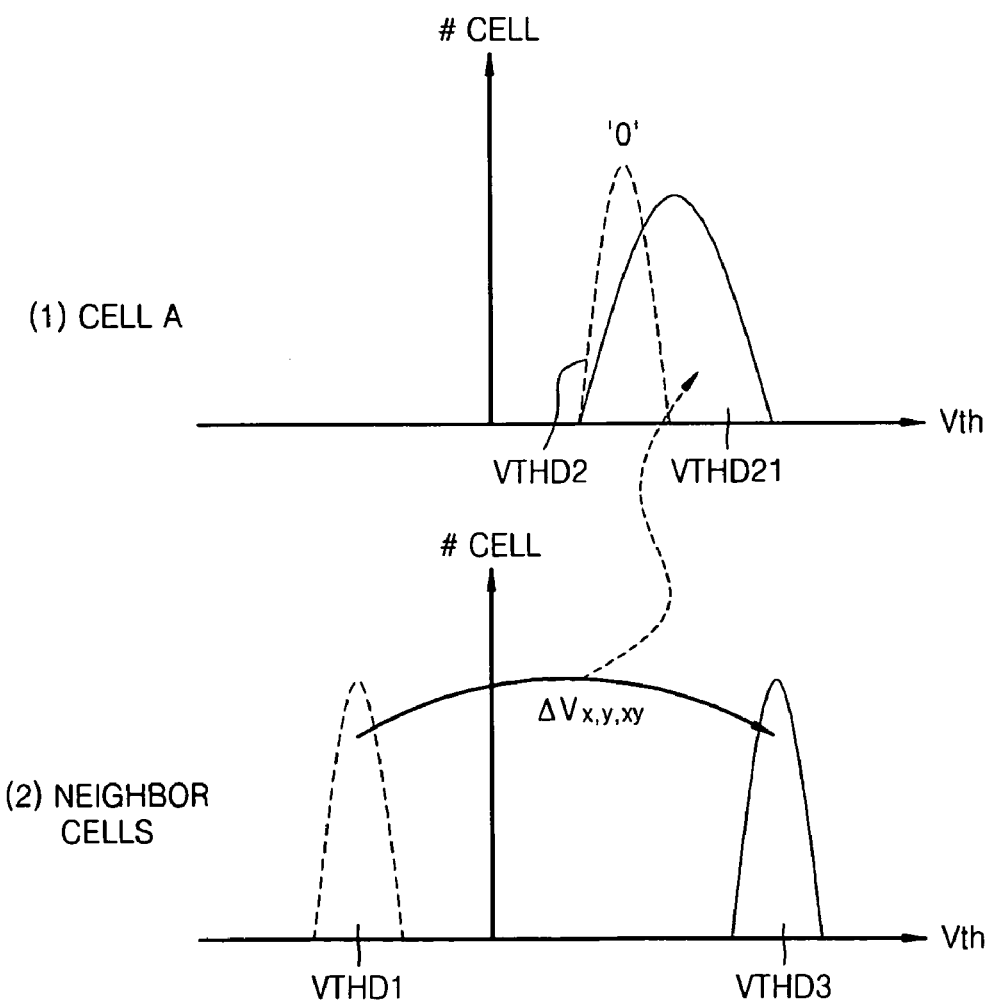

FIG. 2B illustrates a case in which the threshold voltage of the memory cell CELL A, which has already been programmed, is shifted due to capacitive couplings Cx, Cy, and Cxy which exist between each of the adjacent word lines, or between each of the adjacent bit lines, when neighbor cells are programmed after the threshold voltage of the memory cell CELL A is programmed so as to correspond to the second threshold voltage distribution VTHD2.

In the case of FIG. 2B, initially the threshold voltage of the memory cell CELL A has the second threshold voltage distribution VTHD2. However, neighbor cells to the memory cell CELL A may be programmed to another threshold voltage distribution (for example, the first threshold voltage distribution VTHD1, the third threshold voltage distribution VTHD3, or the fourth threshold voltage distribution VTHD4 in FIG. 2A). In this case, the threshold voltage distribution of the memory cell CELL A, which has already been programmed, may be shifted, e.g., to another threshold voltage distribution between and overlapping that programmed in the CELL A and that programmed in the neighbor cells.

In the particular example illustrated in FIG. 2B, the threshold voltage distribution of the memory cell CELL A, which has already been programmed, may be shifted when the neighbor cells are programmed from the first threshold voltage distribution VTHD1 to the third threshold voltage distribution VTHD3, e.g., to another threshold voltage distribution VTHD21. The threshold voltage distribution of the memory cell CELL A may also be shifted when the neighbor cells are programmed to threshold voltage distributions other than the first threshold voltage distribution VTHD1.

Figure 3A:
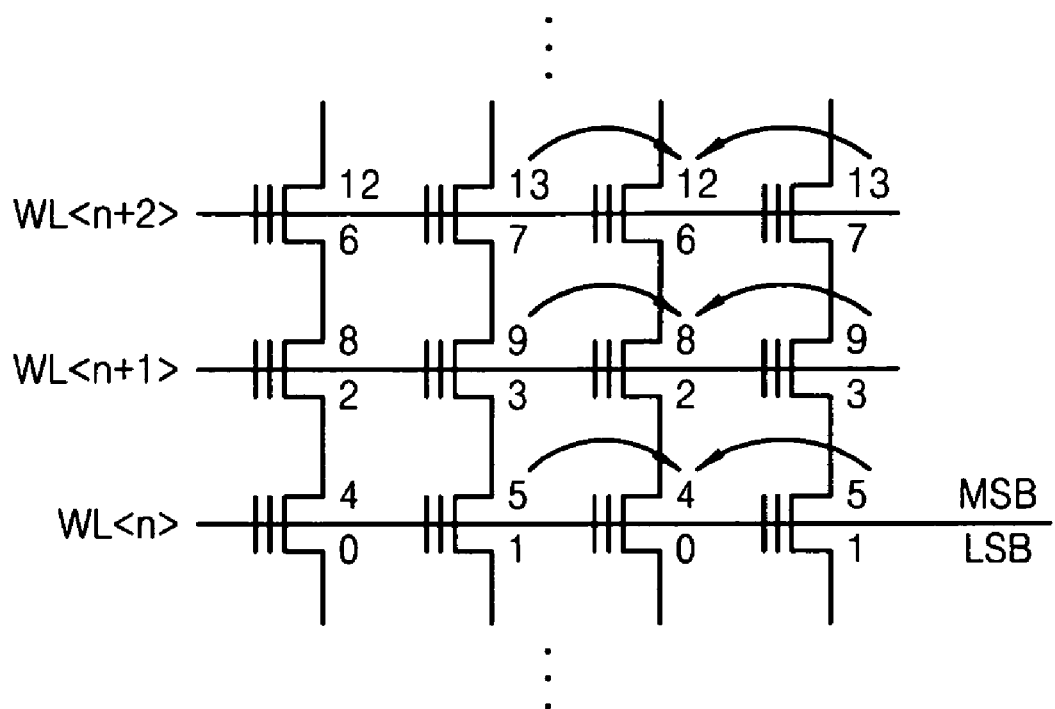
FIG. 3A illustrates a part of a non-volatile memory device which separately programs memory cells connected to odd bit lines and memory cells connected to even bit lines.

FIG. 3A illustrates a part of a non-volatile memory device which separately programs memory cells connected to odd bit lines and memory cells connected to even bit lines. Referring to FIG. 3A, the memory cells connected to first and third bit lines, and the memory cells connected to second and fourth bit lines may be separately programmed. Numbers 0-13, as illustrated in FIG. 3A, indicate a programming order.

As illustrated in FIG. 3A, when the memory cells connected to the even bit lines are first programmed and then the memory cells connected to the odd bit lines are programmed, a programming voltage for programming the memory cells connected to the odd bit lines may change a threshold voltage of the memory cells connected to the even bit lines, due to capacitive couplings which exist between each of the adjacent bit lines.

Figure 3B:
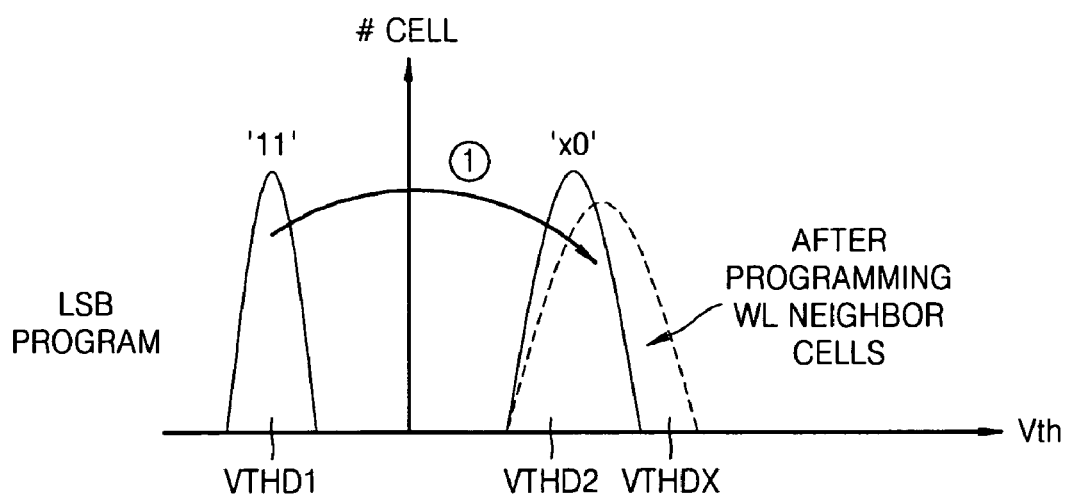
FIG. 3B illustrates an example in which data is programmed in the non-volatile memory device of FIG. 3A.
Figure 3B:
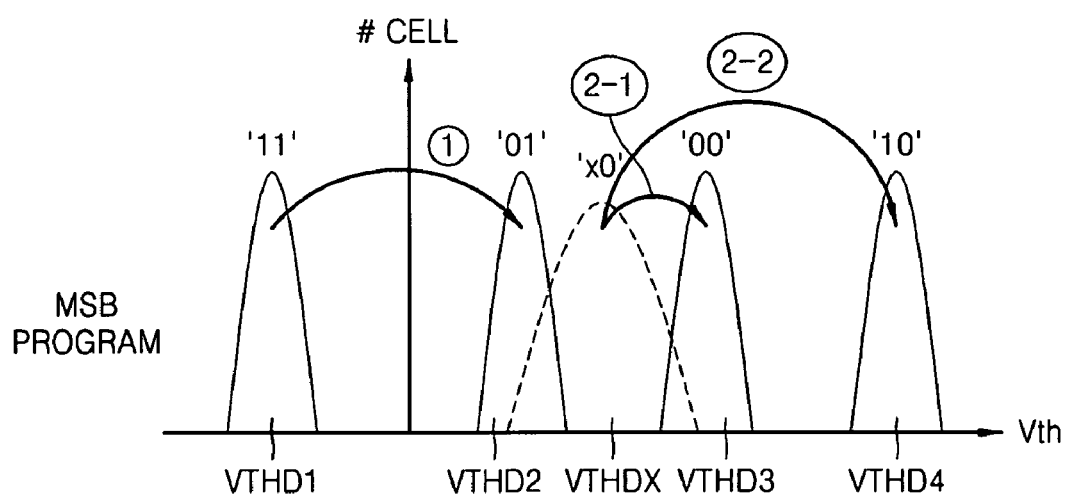

An upper diagram of FIG. 3B corresponds to an example in which a threshold voltage distribution of the memory cells connected to the even bit lines is changed from a second threshold voltage distribution VTHD2 to a changed threshold voltage distribution VTHDX, due to the programming voltage which is applied to the memory cells connected to the odd bit lines, after a first bit, e.g., a least significant bit (LSB), has been programmed on the memory cells connected to the even bit lines.

A lower diagram of FIG. 3B corresponds to an example in which a second bit, e.g., a most significant bit (MSB), is programmed on a memory cell. For example, when a threshold voltage distribution of the memory cell is the changed threshold voltage distribution VTHDX, if the second bit is 0, a threshold voltage of the memory cell is programmed so as to correspond to a third threshold voltage distribution VTHD3. Otherwise, if the second bit is 1, the threshold voltage of the memory cell is programmed so as to correspond to a fourth threshold voltage distribution VTHD4.

FIGS. 4A through 5B illustrate a non-volatile memory device which simultaneously programs memory cells connected to adjacent bit lines. The non-volatile memory device of FIGS. 4A through 5B may simultaneously program the memory cells connected to the adjacent bit lines, thereby preventing a threshold voltage of the memory cells from being changed due to capacitive couplings Cx, Cy, and Cxy.

Figure 4A:
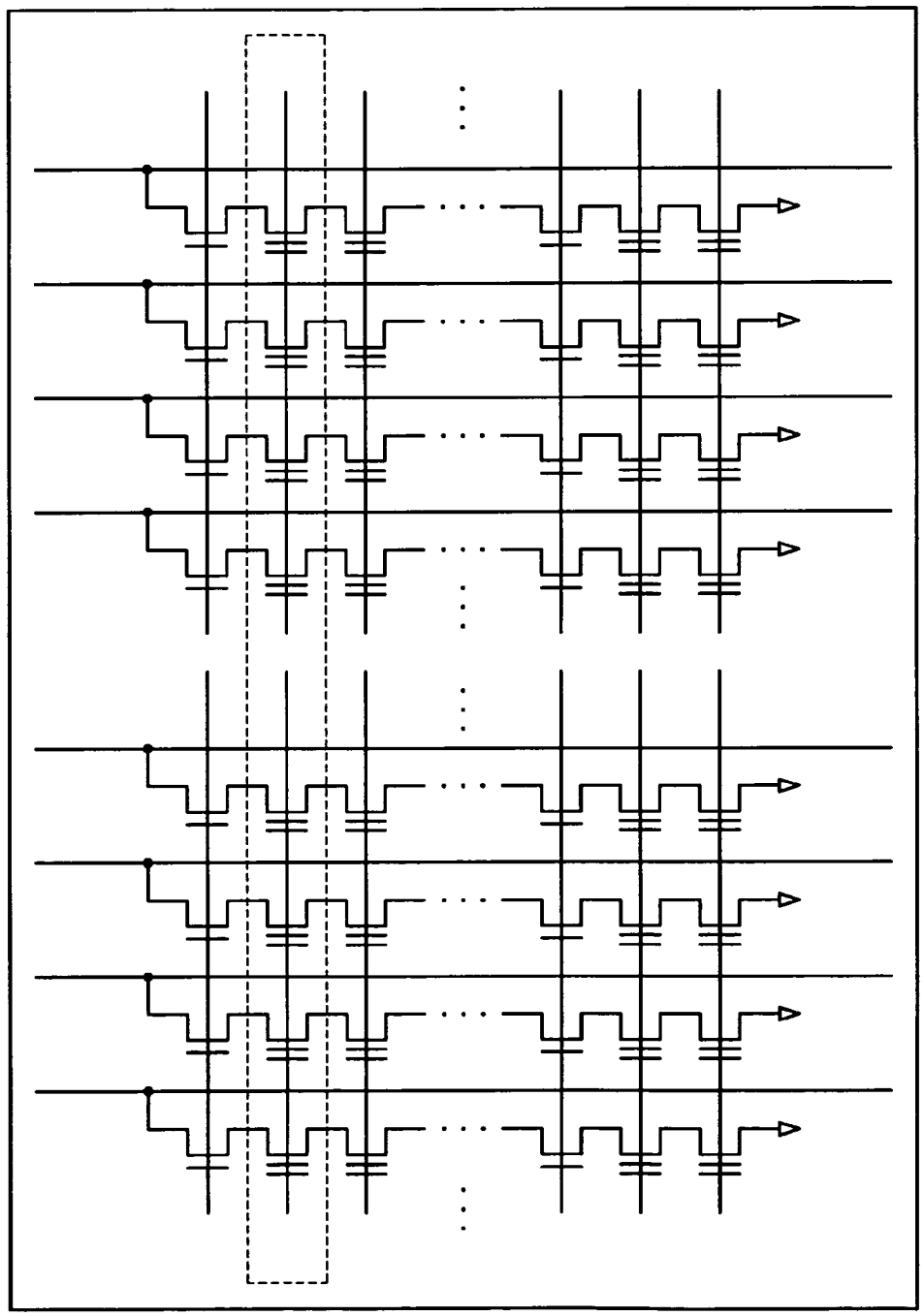
FIGS. 4A through 5B illustrate a non-volatile memory device which simultaneously programs memory cells connected to adjacent bit lines.
Figure 4B:
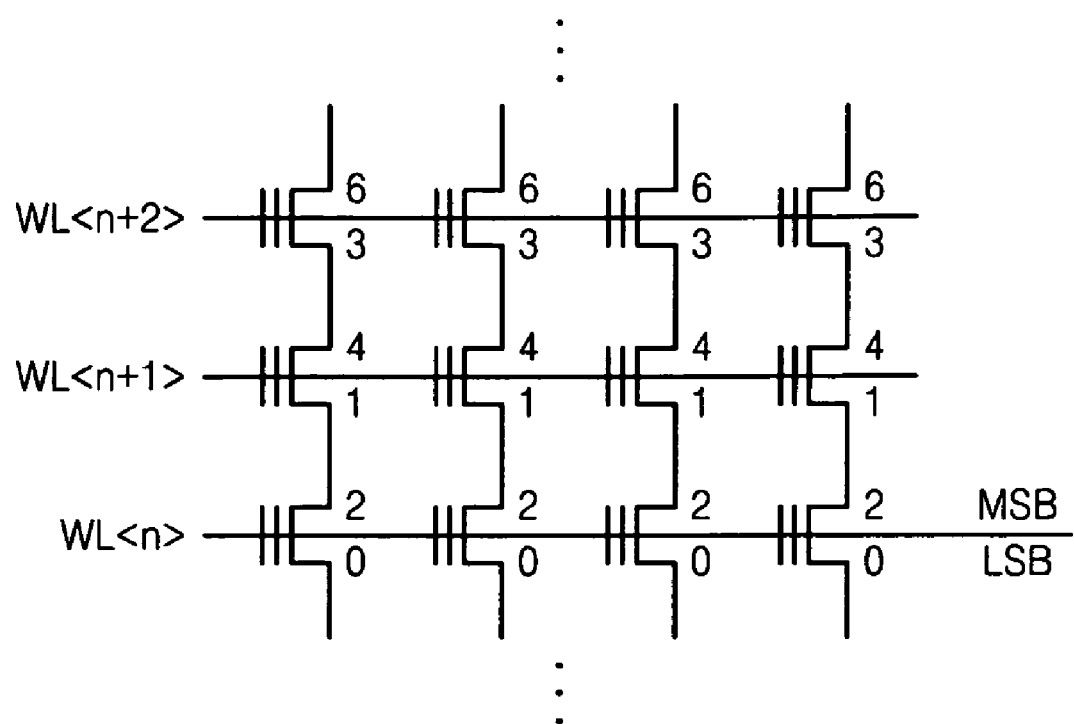

The non-volatile memory device illustrated in FIG. 4A may simultaneously programs memory cells connected to the same word line. FIG. 4B illustrates part of the memory cells illustrated in FIG. 4A.

Numbers 0-6 illustrated in FIG. 4B indicate a programming order. Referring to the numbers, after the memory cells having the number 0 and connected to a word line (for example, WL<n>) may be simultaneously programmed, the memory cells having the number 1 and connected to another word line (for example, WL<n+1>) may be simultaneously programmed, and so forth.

Figure 5A:
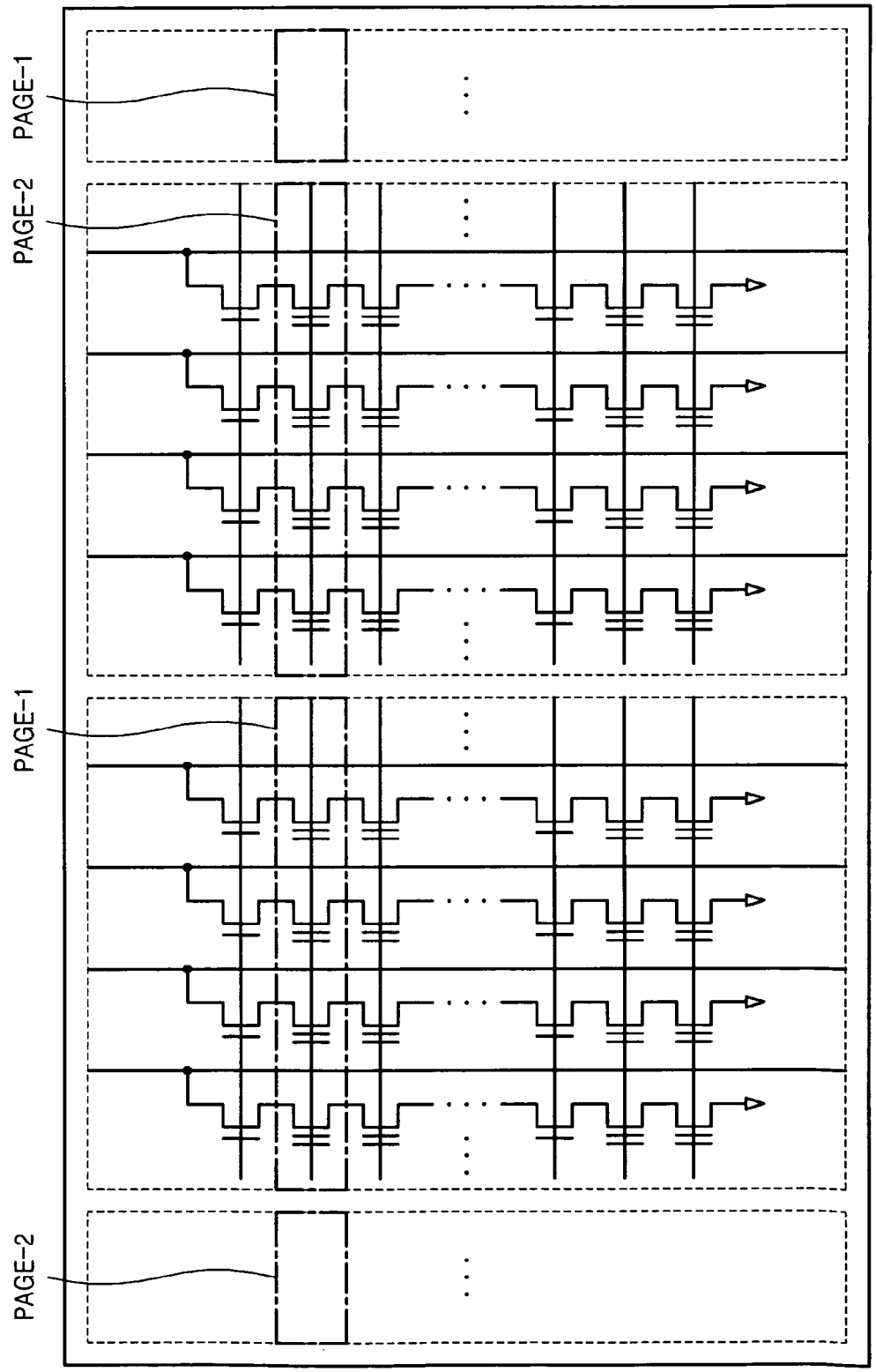
Figure 5B:
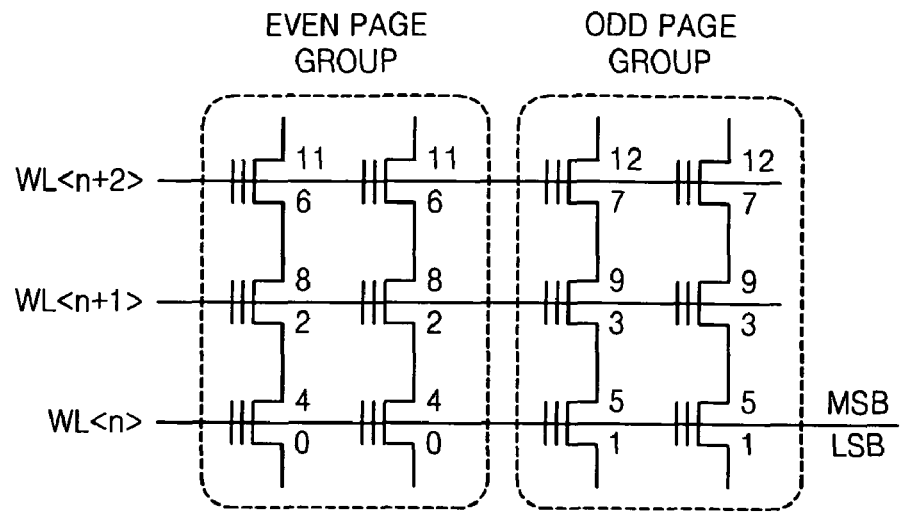

The non-volatile memory device illustrated in FIG. 5A programs the memory cells in a unit of a page group. FIG. 5B illustrates a part of the memory cells illustrated in FIG. 5A.

Numbers 0-12 illustrated in FIG. 5B indicate a programming order. Referring to the numbers, after the memory cells having the number 0, belonging to an even page group, and connected to a word line (for example, WL<n>), are programmed, the memory cells having the number 1, belonging to an odd page group and connected to the word line (for example, WL<n>) are programmed.

Figure 6:
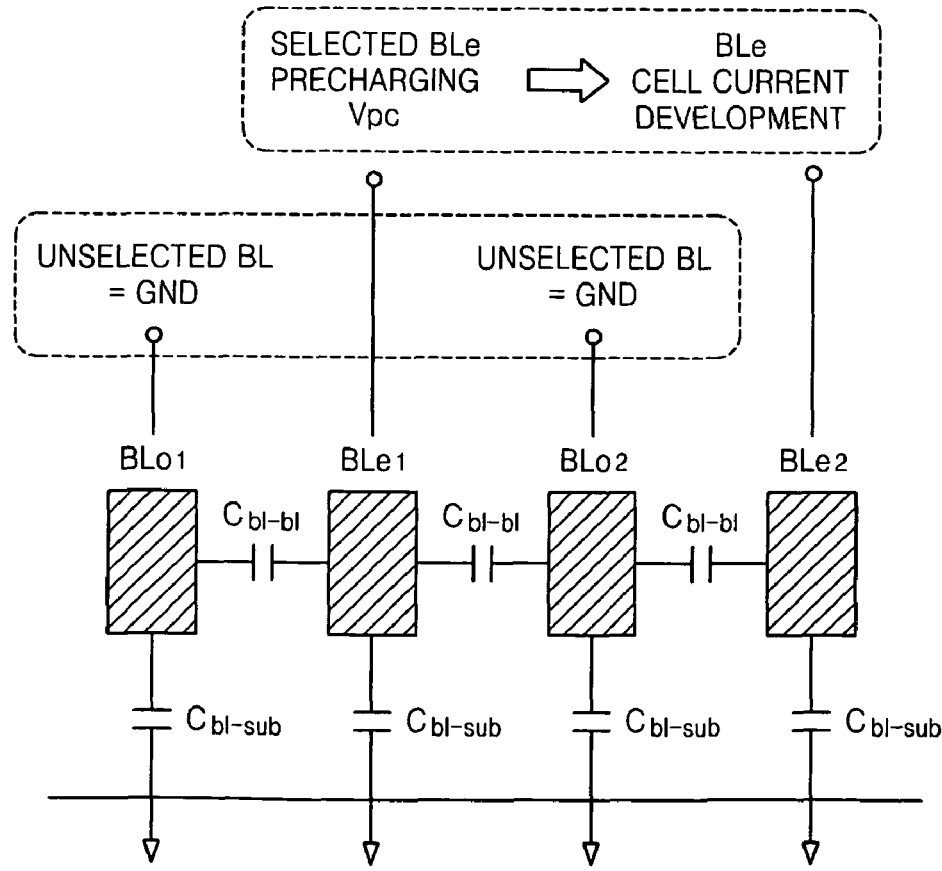
FIG. 6 illustrates adjacent bit lines of FIGS. 4A through 5B in detail.

FIG. 6 illustrates a diagram of the adjacent bit lines of FIGS. 4A through 5B in detail. In particular, FIG. 6 illustrates a capacitive coupling Cbl-bl which exists between adjacent bit lines BLo1 and BLe1, between the adjacent bit lines BLe1 and BLo2, or between adjacent bit lines BLo2 and BLe2. Meanwhile, in order to read or verify data programmed on the memory cells, a read current may be supplied via bit lines which are connected to a target read memory cell.

In order to read data of adjacent memory cells, when the read current simultaneously flows in adjacent bit lines BLo1, BLe1, BLo2, and BLe2, a sensing noise may occur due to the capacitive coupling Cbl-bl which exists between the adjacent bit lines BLo1, BLe1, BLo2, and BLe2.

In order to reduce or prevent such a sensing noise due to the capacitive coupling Cbl-bl, the adjacent bit lines BLo1, BLe1, BLo2, and BLe2 may be divided into odd bit lines BLo1 and BLo2, and even bit lines BLe1 and BLe2. Then, a read operation or a verification operation may be separately performed with respect to the odd bit lines BLo1 and BLo2, and the even bit lines BLe1 and BLe2.

FIG. 6 corresponds to the case in which data of the even bit lines BLe1 and BLe2 is read. After a precharge voltage Vpc is applied to precharge the even bit lines BLe1 and BLe2, the read current may be supplied. A ground voltage may be applied to the odd bit lines BLo1 and BLo2. After the data of the even bit lines BLe1 and BLe2 is read, data of the odd bit lines BLo1 and BLo2 may be read. That is, after the precharge voltage Vpc is applied to precharge the odd bit lines BLo1 and BLo2, the read current may be supplied. Then, the ground voltage may be applied to the even bit lines BLe1 and BLe2.

A method of programming/verifying memory cell data according to embodiments may divide a plurality of bit lines into a plurality of bit line groups, and perform the verification operation in a unit of a bit line group. For the verification operation in the unit of the bit line group, with respect to memory cells corresponding to each of the bit line groups, data written to the memory cells may be verified with a varying verification voltage.

The method of programming/verifying memory cell data according to embodiments may be applied to the non-volatile memory device of FIGS. 4A through 5B, which simultaneously programs the memory cells connected to the adjacent bit lines. For example, after memory cells connected to odd bit lines and memory cells connected to even bit lines are simultaneously programmed, the memory cells connected to the odd bit lines and the memory cells connected to the even bit lines may be separately verified.

Figure 7:
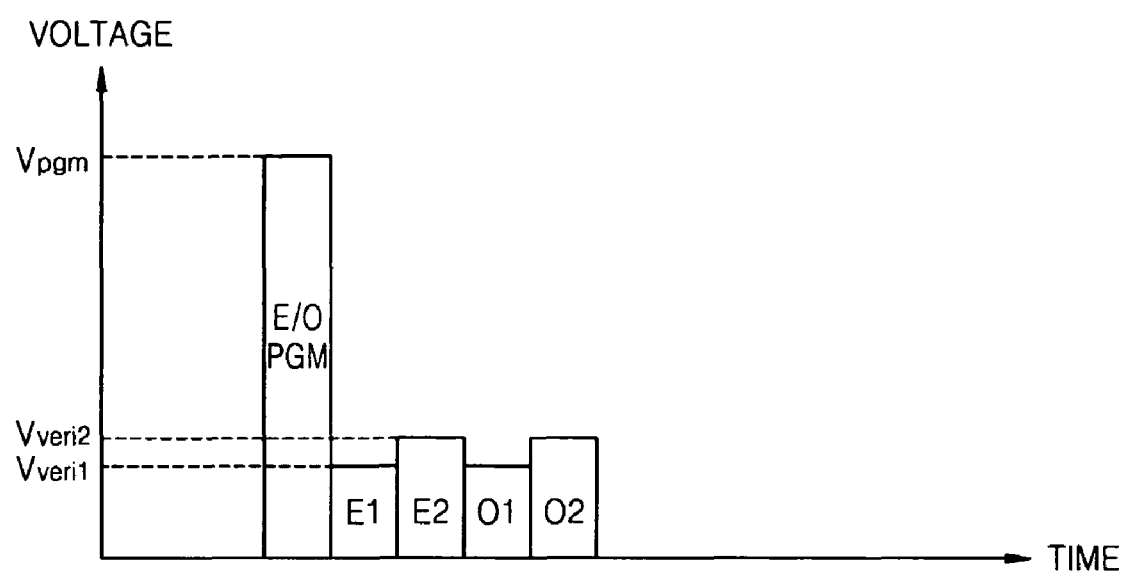
FIG. 7 illustrates a method of programming/verifying memory cell data, according to a first embodiment of the present invention.

FIG. 7 illustrates a method of programming/verifying memory cell data according to a first embodiment of the present invention. The method of programming/verifying memory cell data according to the first embodiment of the present invention may divide a plurality of bit lines into a first bit line group including even bit lines and a second bit line group including odd bit lines, and may sequentially perform a verification operation with respect to the first bit line group and the second bit line group.

The method of programming/verifying memory cell data according to the first embodiment of the present invention may have a first verification stage, in which memory cells connected to the first bit line group are verified, and a second verification stage, in which memory cells connected to the second bit line group are verified.

The first verification stage may verify memory cells connected to the even bit lines using a first verification voltage $V_{VERI1}$, and then may verify memory cells connected to the even bit lines using a second verification voltage $V_{VERI2}$. An E1 period of FIG. 7 is a period in which memory cells connected to even bit lines are verified using the first verification voltage $V_{VERI1}$, and an E2 period is a period in which memory cells connected to even bit lines are verified using the second verification voltage $V_{VERI2}$.

The second verification stage may verify memory cells connected to odd bit lines using the first verification voltage $V_{VERI1}$, and then may verify memory cells connected to the odd bit lines by using the second verification voltage $V_{VERI2}$. An O1 period of FIG. 7 is a period in which memory cells connected to odd bit lines are verified using the first verification voltage $V_{VERI1}$, and an O2 period is a period in which memory cells connected to odd bit lines are verified using the second verification voltage $V_{VERI2}$.

The method of programming/verifying memory cell data according to the first embodiment of the present invention may be applied to the non-volatile memory device of FIGS. 4A through 5B, which simultaneously programs the memory cells connected to the adjacent bit lines. An E/O PGM period illustrated in FIG. 7 indicates a period in which memory cells connected to odd bit lines and memory cells connected to even bit lines are simultaneously programmed.

The first and second verification stages of the method of programming/verifying memory cell data according to the first embodiment may be performed after a programming stage in which data is written to the memory cells. Referring to FIG. 7, after data is simultaneously written to the memory cells connected to the odd bit lines and to the memory cells connected to the even bit lines in the E/O PGM period, the data written in the E/O PGM period may be verified in the E1 period or in the O2 period. A programming voltage Vpgm used in the programming stage (the E/O PGM period) may be higher than the first and second verification voltages $V_{VERI1}$ and $V_{VERI2}$ used in the first and second verification stages (i.e., the E1, E2, O1, and O2 periods).

Figure 10:
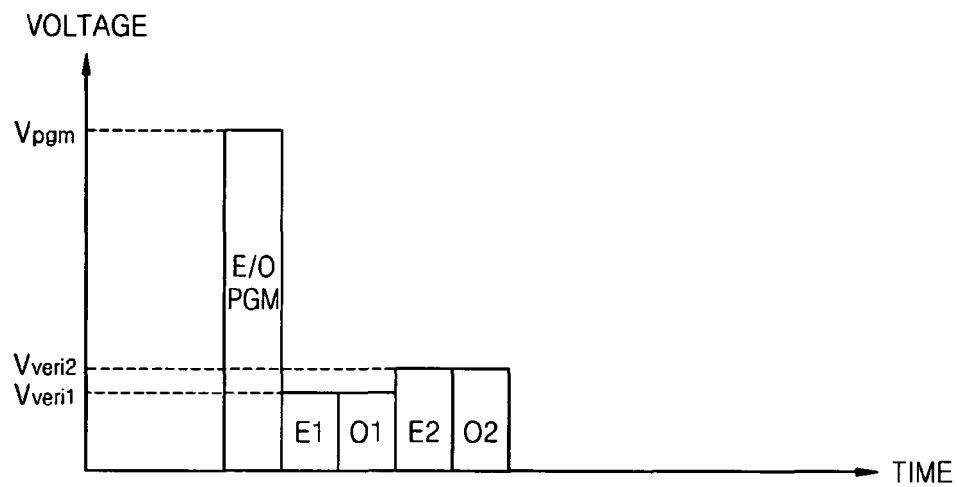
FIG. 10 illustrates a first comparative method of programming/verifying memory cell data.

FIG. 10 illustrates a first comparative method of programming/verifying memory cell data. The first comparative method of programming/verifying memory cell data, as compared to the first embodiment of the present invention, verifies the memory cells connected to the even bit lines by using the first verification voltage $V_{VERI1}$ (an E1 period of FIG. 10), and verifies the memory cells connected to the odd bit lines by using the first verification voltage $V_{VERI1}$ (an O1 period of FIG. 10). After that, the memory cells connected to the even bit lines are verified using the second verification voltage $V_{VERI2}$ (an E2 period of FIG. 10), and the memory cells connected to the odd bit lines are verified by using the second verification voltage $V_{VERI2}$ (an O2 period of FIG. 10).

In order to verify a memory cell connected to a bit line, time to prepare the bit line to be used in verification is required. Thus, in order to verify memory cells connected to another bit line group after memory cells connected to a bit line group are verified, the time to prepare bit lines of the another bit line group is required.

The method of programming/verifying memory cell data according to the first embodiment of the present invention verifies the memory cells connected to the even bit lines first and then verifies the memory cells connected to the odd bit lines. Thus, the number of times for preparing the even bit lines is once, and the number of times for preparing the odd bit lines is also once. That is, the total number of times for preparing the bit lines is twice in the method of programming/verifying memory cell data according to the first embodiment of the present invention.

On the other hand, the first comparative method of programming/verifying memory cell data, as compared to the first embodiment of the present invention, verifies the memory cells connected to the even bit lines and the memory cells connected to the odd bit lines by using the first verification voltage $V_{VERI1}$, and then verifies the memory cells connected to the even bit lines and the memory cells connected to the odd bit lines by using the second verification voltage $V_{VERI2}$. Thus, the total number of times for preparing the bit lines is four times in the first comparative method of programming/verifying memory cell data, as compared to total number of times of the first embodiment of the present invention.

Thus, the method of programming/verifying memory cell data according to the first embodiment of the present invention may reduce the number of times for preparing the bit lines in the verification operation, as compared to the first comparative method of programming/verifying memory cell data.

Figure 9A:
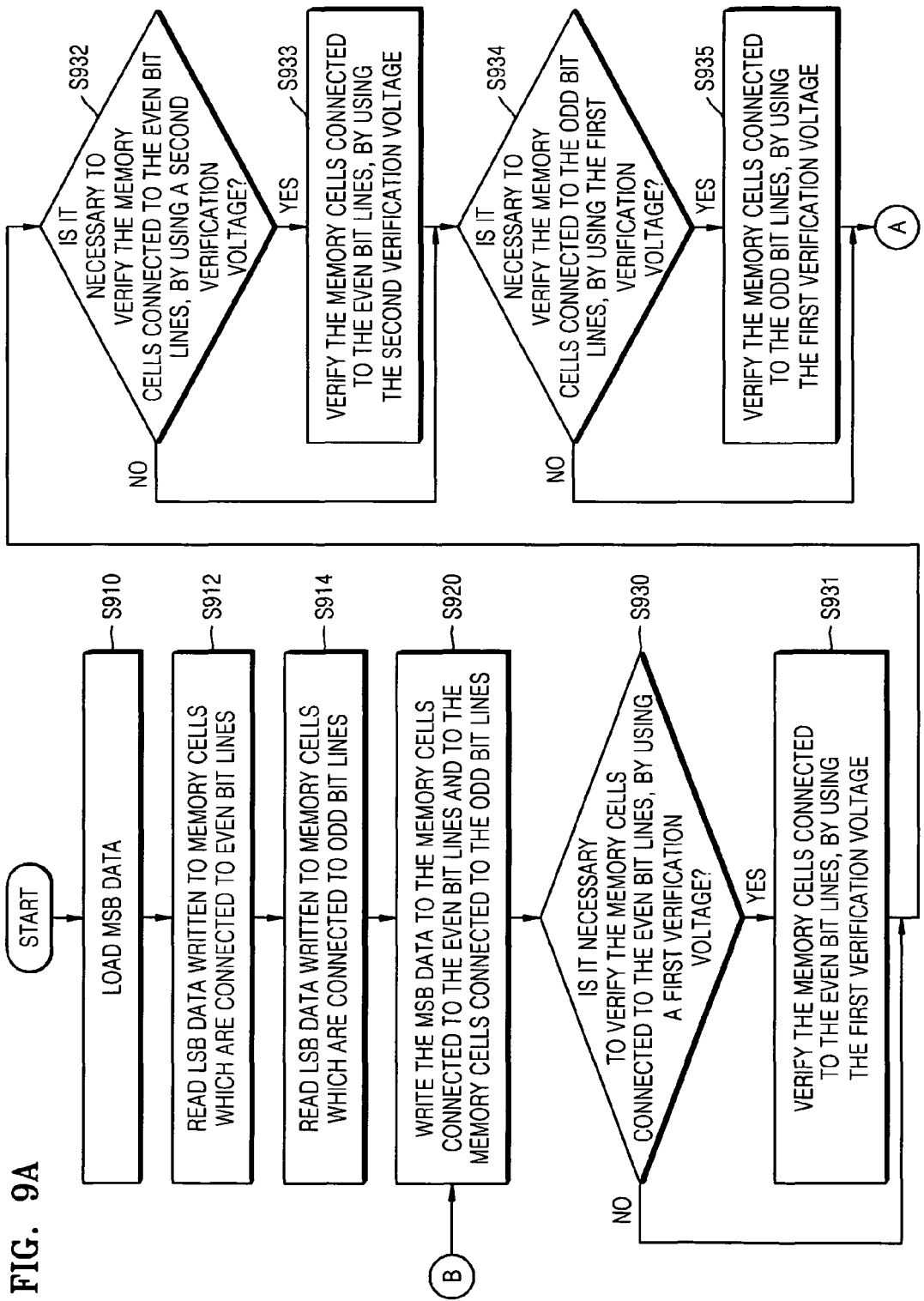
FIGS. 9A and 9B illustrate a flowchart of the method of programming/verifying memory cell data according to the first embodiment of the present invention.
Figure 9B:
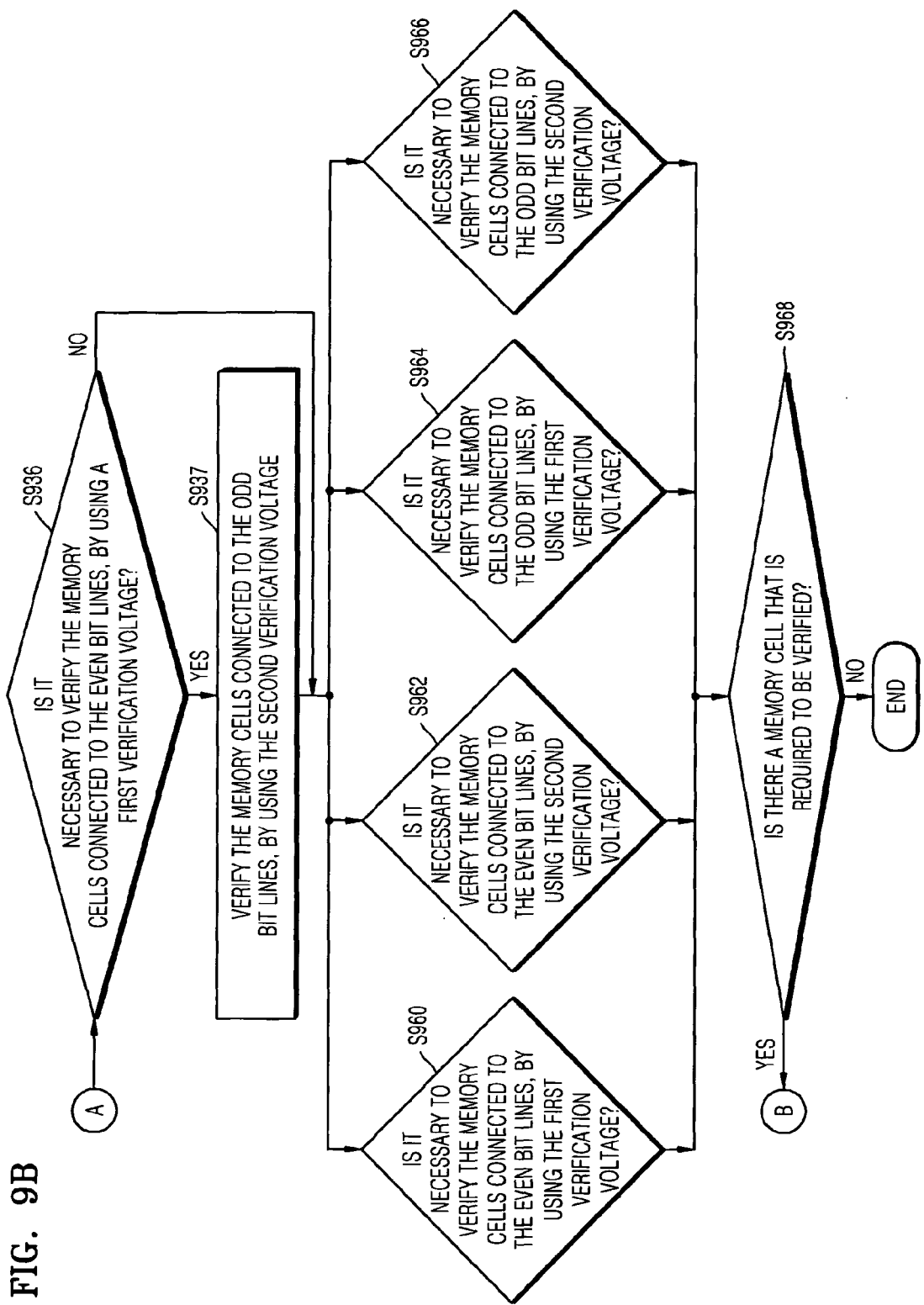

FIGS. 9A and 9B illustrate a flowchart of the method of programming/verifying memory cell data according to the first embodiment of the present invention.

In the flowchart of FIGS. 9A and 9B, most significant bit (MSB) data is written and verified. However, the method of programming/verifying memory cell data according to the first embodiment of the present invention is not limited thereto, but may also be applied to data which has a plurality of verification voltages.

The method of programming/verifying memory cell data according to the first embodiment of the present invention loads the MSB data (operation S910), reads least significant bit (LSB) data which has been written to memory cells connected to even bit lines (operation S912), and reads LSB data which has been written to memory cells connected to odd bit lines (operation S914). Based on the read LSB data, the MSB data may be simultaneously written to the memory cells connected to the even bit lines and to the memory cells connected to the odd bit lines (operation S920).

After the MSB data is written, whether the memory cells connected to even bit lines and the memory cells connected to odd bit lines are required to be verified using each of a first verification voltage and a second verification voltage may be repeatedly determined (operations S930, S932, S934, and S936). If required, memory cells connected to one of the even and odd bit lines may be verified respectively using one of the first and second verification voltages (operations S931, S933, S935, and S937).

After that, whether there are memory cells requiring verification may be determined again (S960, S962, S964, S966, and S968). If there are memory cells requiring verification, the operation of writing the MSB data (i.e., operation S920) and operations thereafter may be performed again.

Referring to FIG. 7, data may be verified by using the two verification voltages. However, the number of verification voltages may be over three. When the number of threshold voltage distributions increases, wherein a threshold voltage of a memory cell may correspond to the threshold voltage distributions, the number of data bits, which may be stored to the memory cell, also increases. Accordingly, the number of verification voltages may increase. When the number of verification voltages is over three, the method of programming/verifying memory cell data according to the embodiments may verify the data by using all of the verification voltages in the first verification stage, and then may verify the data in the second verification stage. Thus, although the number of verification voltages increases, the number of times for preparing bit lines for the verification operation may be constantly maintained.

Also, the method of programming/verifying memory cell data according to embodiments may verify memory cells connected to the first bit line group using at least two verification voltages from among at least the three verification voltages, and then may verify memory cells connected to the second bit line group. After that, data verification may be performed using the rest of the at least three verification voltages. For example, when the number of verification voltages is four, memory cells connected to the first bit line group may be verified using a first verification voltage and a second verification voltage, and memory cells connected to the second bit line group may be verified using the first verification voltage and the second verification voltage. After that, memory cells connected to the first bit line group may be verified using a third verification voltage and a fourth verification voltage, and then memory cells connected to the second bit line group may be verified using the third verification voltage and the fourth verification voltage. Furthermore, the data verification may be performed several times using at least two verification voltages. For example, when the number of verification voltages is eight, the data verification may be performed four times using two verification voltages, or may be performed twice using four verification voltages.

The method of programming/verifying memory cell data according to embodiments may perform the data verification by sequentially increasing the number of verification voltages. In FIG. 7, the second verification voltage is higher than the first verification voltage. That is, after the memory cells connected to the bit lines of the even bit line group (or, the odd bit line group) are verified by using the first verification voltage that is relatively lower than the second verification voltage, and the memory cells connected to the bit lines of the even bit line group (or, the odd bit line group) may be verified by using the second verification voltage that is relatively higher than the first verification voltage. In FIG. 7, the two verification voltages are sequentially increased. However, in the case where the number of verification voltages is over three, the data verification may also be performed, with the three verification voltages sequentially increasing.

The method of programming/verifying memory cell data according to embodiments may verify memory cells connected to a plurality of bit lines corresponding to the same bit line group. For example, memory cells connected to the even bit lines may be simultaneously verified using the first verification voltage in the E1 period of FIG. 7, and memory cells connected to the even bit lines may be simultaneously verified using the second verification voltage in the E2 period of FIG. 7. In this manner, the memory cells connected to the odd bit lines may be simultaneously verified in the O1 and O2 periods of FIG. 7.

The method of programming/verifying memory cell data according to embodiments may supply a develop current to a memory cell via a bit line, so as to verify data of the memory cell. The develop current may be large enough to read the data written to the memory cell. The develop current may be supplied via target verification bit lines, and may not be supplied to non-target verification bit lines. Furthermore, the non-target verification bit lines may be ground. For example, in the E1 and E2 periods of FIG. 7, the develop current may be supplied to the even bit lines and may not be supplied to the odd bit lines. In the E1 period of FIG. 7, the develop current may be supplied to the even bit lines, and the memory cells may be verified using the first verification voltage. In the E2 period of FIG. 7, the develop current may be supplied to the even bit lines, and the memory cells may be verified using the second verification voltage.

The method of programming/verifying memory cell data according to embodiments may program the memory cell data by applying the programming voltage Vpgm via a selected word line, and may verify the memory cell data by applying the verification voltages (that is, the first and second verification voltages $V_{VERI1}$ and $V_{VERI2}$) via the selected word line and by supplying the develop current via a selected bit line.

Figure 8:
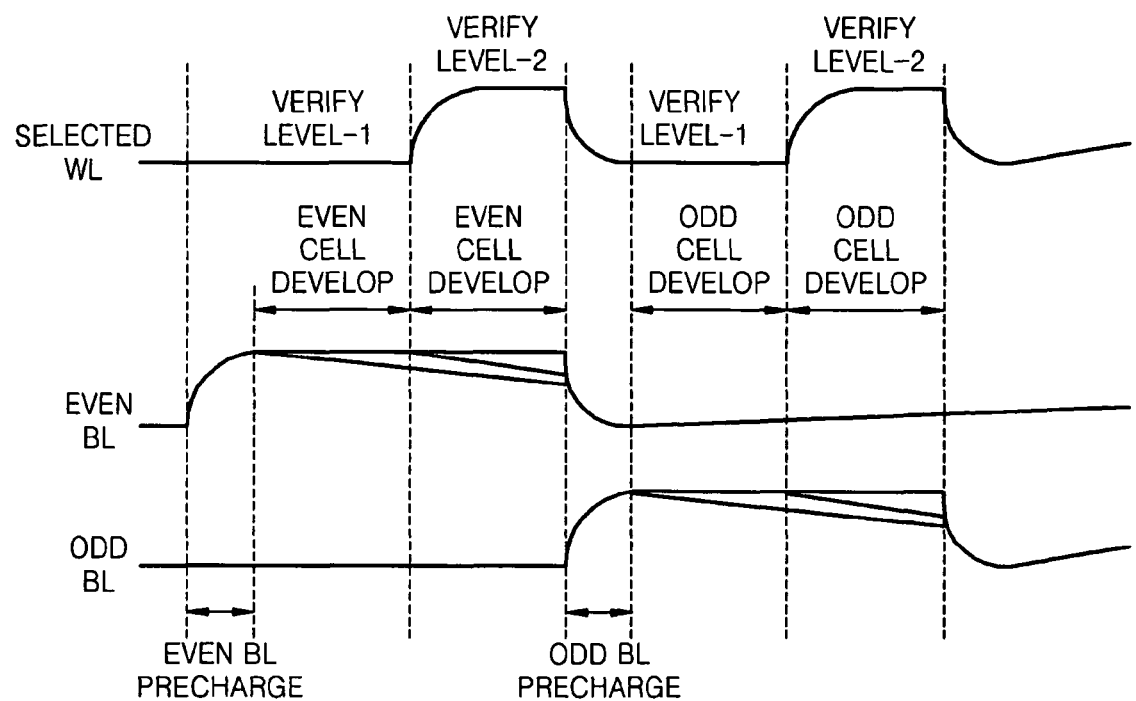
FIG. 8 illustrates a timing diagram for the method of programming/verifying memory cell data as described in FIG. 7.

FIG. 8 illustrates a timing diagram for describing the method of programming/verifying memory cell data as described in FIG. 7. As described above, in order to verify the memory cell connected to the bit line, time to prepare the bit line to be used in the verification is required. In FIG. 8, as an example of an operation for preparing the bit line, an operation for precharging the bit line is illustrated.

Referring to FIG. 8, the method of programming/verifying memory cell data according to the first embodiment of the present invention may precharge the even bit lines. After that, a word line connected to target verification memory cells may be selected, and the first verification voltage $V_{VERI1}$ is applied via the selected word line. After that, the develop current may be supplied to the memory cells connected to the even bit lines. Accordingly, the target verification memory cells may be verified using the first verification voltage $V_{VERI1}$. After the memory cells connected to the even bit lines are verified using the first verification voltage $V_{VERI1}$, a voltage applied via the selected word line may be changed from the first verification voltage $V_{VERI1}$ to the second verification voltage $V_{VERI2}$. After that, the develop current may be supplied to the memory cells connected to the even bit lines. Thus, the target verification memory cells may be verified using the second verification voltage $V_{VERI2}$.

After the memory cells connected to the even bit lines are verified using the second verification voltage $V_{VERI2}$, the odd bit lines may be precharged. Then, the voltage applied via the selected word line may be changed from the second verification voltage $V_{VERI2}$ to the first verification voltage $V_{VERI1}$. After that, the develop current may be supplied to the memory cells connected to the odd bit lines. Thus, the target verification memory cells may be verified using the first verification voltage $V_{VERI1}$. After the memory cells connected to the odd bit lines are verified using the first verification voltage $V_{VERI1}$, the voltage applied via the selected word line may be changed from the first verification voltage $V_{VERI1}$ to the second verification voltage $V_{VERI2}$. After that, the develop current may be supplied to the memory cells connected to the odd bit lines. Thus, the target verification memory cells may be verified using the second verification voltage $V_{VERI2}$.

Figure 11:
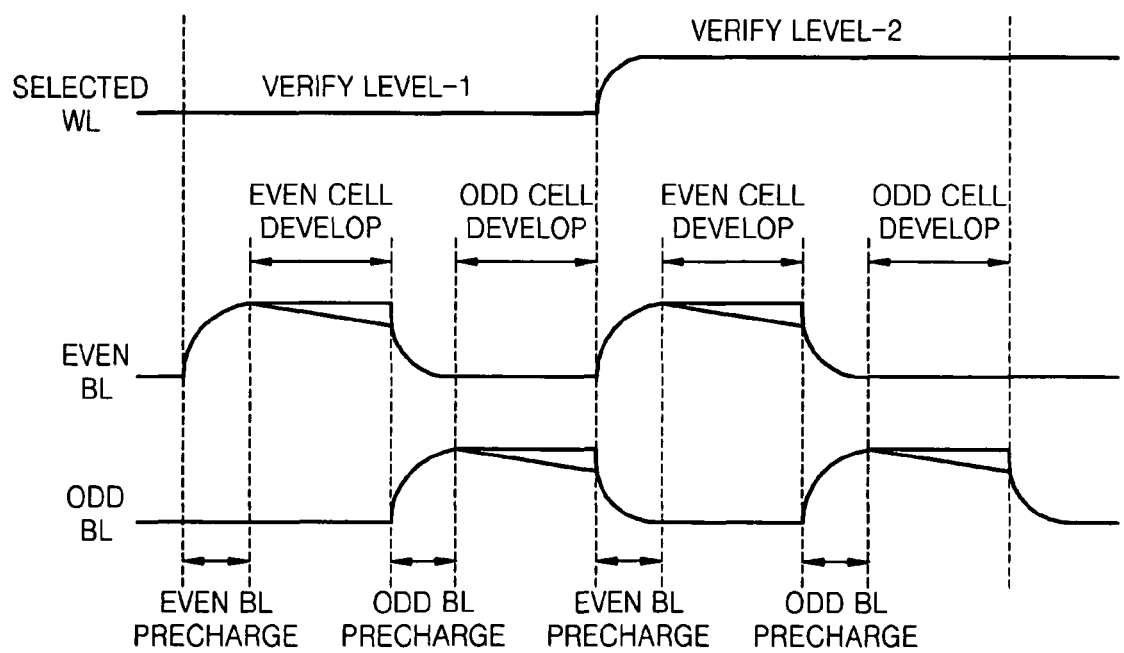
FIG. 11 illustrates a timing diagram for the first comparative method of programming/verifying memory cell data as illustrated FIG. 10.

FIG. 11 illustrates a timing diagram for describing the first comparative method of programming/verifying memory cell data as described in FIG. 10.

Referring to FIG. 11, the first comparative method of programming/verifying memory cell data applies the first verification voltage $V_{VERI1}$ via the selected word line and verifies the memory cells connected to the even bit lines using the first verification voltage $V_{VERI1}$. After that, the memory cells connected to the odd bit lines are verified using the first verification voltage $V_{VERI1}$. Then, the voltage applied via the selected word line is changed from the second verification voltage $V_{VERI2}$ to the first verification voltage $V_{VERI1}$, and the target verification memory cells connected to the even and odd bit lines are sequentially verified.

The method of programming/verifying memory cell data according to the first embodiment of the present invention may perform a precharge once for each of the even bit lines and the odd bit lines. That is, in the method of programming/verifying memory cell data according to the first embodiment of the present invention, the total number of times for precharging the bit lines is twice. On the other hand, the first comparative method of programming/verifying memory cell data forms a precharge twice for each of the even bit lines and the odd bit lines. That is, in the first comparative method of programming/verifying memory cell data, the total number of times for precharging the bit lines is four times. Thus, as compared with the first comparative method of programming/verifying memory cell data, the method of programming/verifying memory cell data according to the first embodiment of the present invention may reduce the number of times for precharging the bit lines in the verification operation.

In the case where a bit line is longer than a word line, a capacitance of the bit line is greater than a capacitance of the word line. In this case, time taken to precharge the bit line is longer than time taken to precharge the word line. Thus, the method of programming/verifying memory cell data according to the first embodiment of the present invention may reduce a data verification time since the number of times for precharging the bit line in the verification operation is reduced.

It has been described that the method of programming/verifying memory cell data according to the first embodiment of the present invention verifies first the memory cells connected to the even bit lines, and then verifies the memory cells connected to the odd bit lines. However, embodiments are not limited thereto, e.g., such an order may be changed. Also, the bit lines may be divided into two groups by using standards other than the odd and even standard.

It has been described that the method of programming/verifying memory cell data according to the first embodiment of the present invention divides the bit lines into the two groups, thereby using the two groups in a data verification. However, the method of programming/verifying memory cell data according to embodiments may divide the bit lines into at least three groups and perform data verification by varying a verification voltage in a unit of a bit line group. When the bit lines are divided into the plurality of bit line groups, bit lines adjacent to each other may correspond to different bit line groups.

Figure 12:
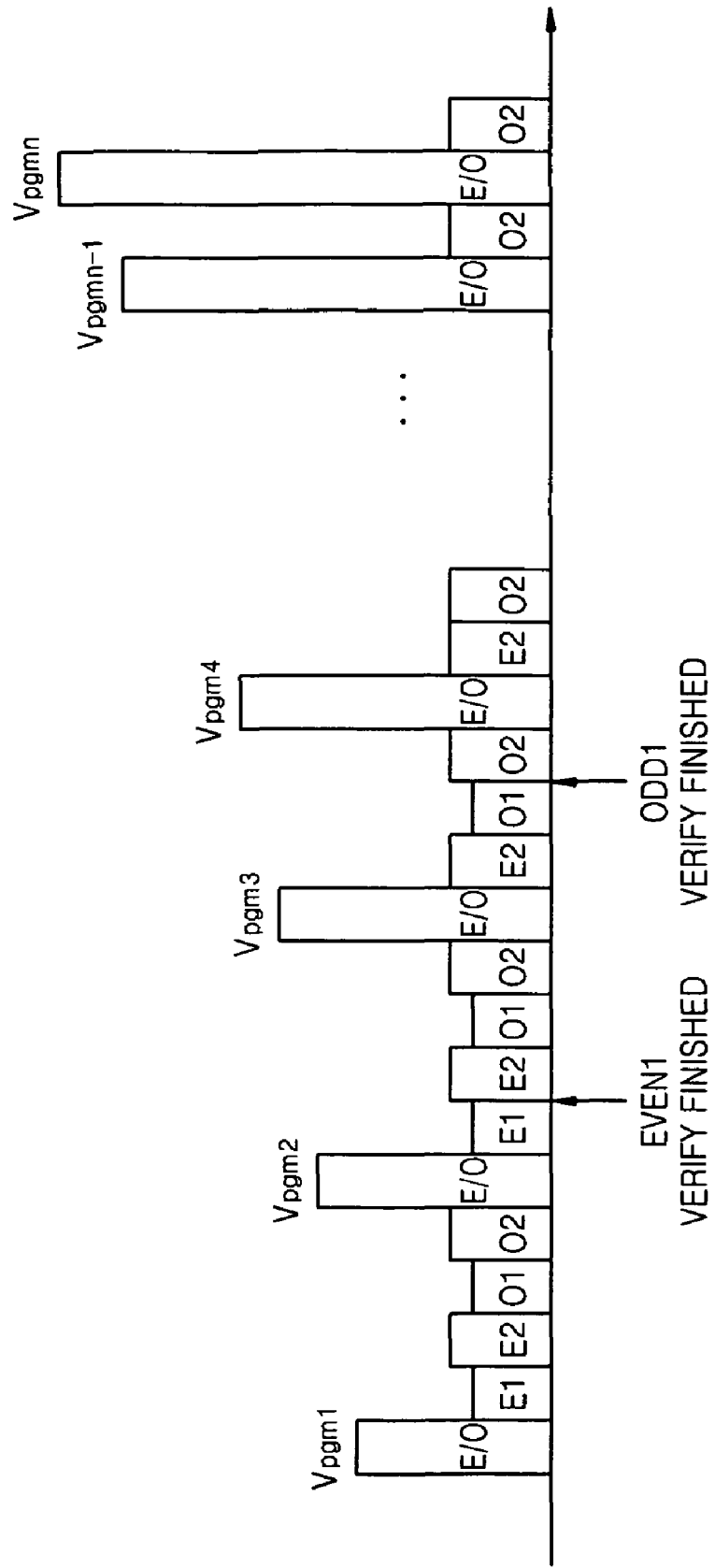
FIG. 12 illustrates a method of programming/verifying memory cell data according to a second embodiment of the present invention.

FIG. 12 illustrates a diagram for a method of programming/verifying memory cell data, according to a second embodiment of the present invention.

The method of programming/verifying memory cell data according to the second embodiment of the present invention may be applied to a procedure in which a bit is programmed with a sequentially increasing programming voltage. In this case, the method of programming/verifying memory cell data according to the second embodiment of the present invention may repeat a procedure in which the memory cell data is verified after a first programming voltage Vpgm1 is applied, and the memory cell data is verified after a second programming voltage Vpgm2, that is higher than the first programming voltage Vpgm1, is applied. This sequence may be repeated until the programming of the bit in a memory cell is completed.

A procedure, in which the memory cell data is verified after a programming voltage (for example, the first programming voltage Vpgm1) is applied, may be identical to the verification procedure of the method of programming/verifying memory cell data according to the first embodiment of the present invention. That is, memory cells connected to the even bit lines may be verified (the E1 and E2 periods) using the first and second verification voltages, and then memory cells connected to the odd bit lines may be verified (the O1 and O2 periods) using the first and second verification voltages.

When first and second verification voltages include a verification voltage that is no longer to be used during verification with respect to an even bit line and an odd bit line, the method of programming/verifying memory cell data according to the second embodiment of the present invention may not perform the verification using the verification voltage that is no longer to be used, after a next programming voltage is applied.

For example, FIG. 12 corresponds to the case in which a verification (an E1 period) of memory cells connected to an even bit line group using the first verification voltage becomes unnecessary after the second programming voltage Vpgm 2 is applied and memory cells connected to the even bit line group are verified (the E1 period) using the first verification voltage. In this case, when a third programming voltage Vpgm3 is applied, the verification (the E1 period) of memory cells connected to the even bit line group using the first verification voltage is not performed. Also, FIG. 12 also corresponds to the case in which a verification (an O1 period) of memory cells connected to an odd bit line group using the first verification voltage is not performed after a fourth programming voltage Vpgm4 is applied.

Figure 13:
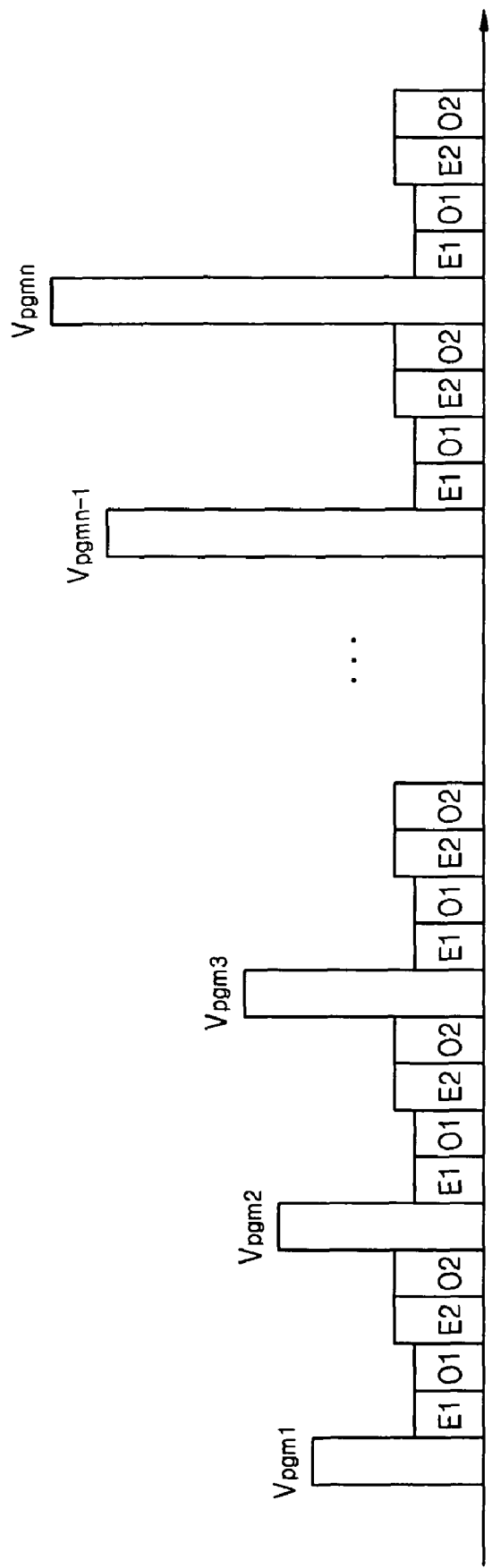
FIG. 13 illustrates a second comparative method of programming/verifying memory cell data.

FIG. 13 illustrates a second comparative method of programming/verifying memory cell data.

Referring to FIG. 13, the second comparative method of programming/verifying memory cell data performs verification in all verification periods (the E1 period, an E2 period, the O1 period, and an O2 period) whenever a programming voltage is applied. Thus, as compared to the second comparative method of programming/verifying memory cell data as described in FIG. 13, the method of programming/verifying memory cell data according to the second embodiment of the present invention may reduce a verification time.

As described above, the number of verification voltages with respect to a memory cell is at least two. However, the number of verification voltages with respect to the memory cell may be one. As illustrated in FIG. 3A, when the number of threshold voltage distributions, to which a threshold voltage of a memory cell may correspond, is two, the number of data bits capable of being stored in the memory cell is one (i.e., a bit). Thus, the number of verification voltages is one. A method of programming/verifying memory cell data according to a third embodiment of the present invention may also be applied to the case in which the number of verification voltages is one.

Figure 14:
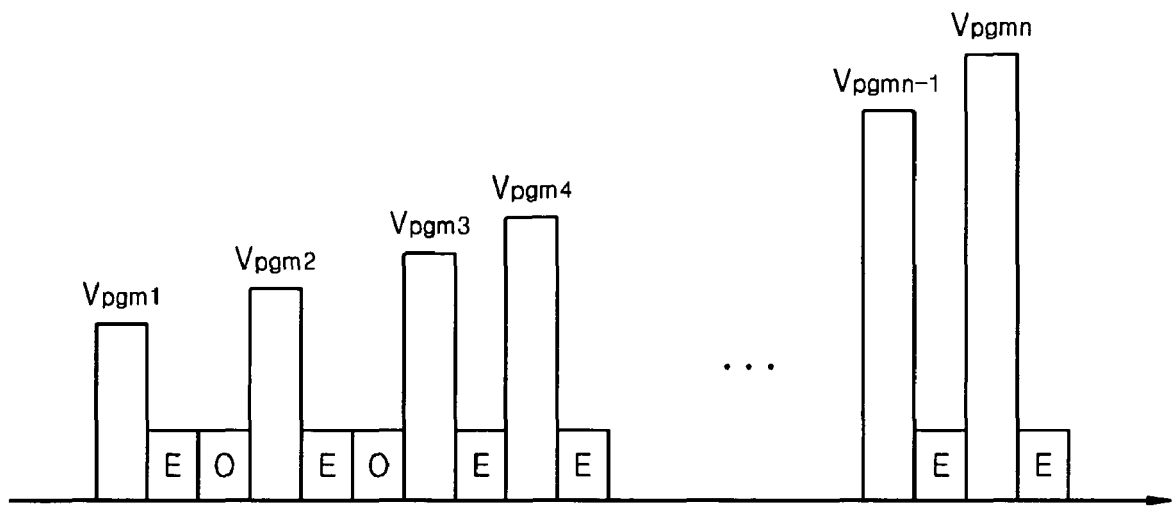
FIG. 14 illustrates a method of programming/verifying memory cell data according to a third embodiment of the present invention.

FIG. 14 illustrates a diagram for a method of programming/verifying memory cell data according to the third embodiment of the present invention. Referring to FIG. 14, when verification voltages with respect to even and odd bit lines includes a verification voltage no longer to be used during verification, the method of programming/verifying memory cell data according to the third embodiment of the present invention may not perform the verification using the verification voltage which is no longer used, after a next programming voltage is applied.

Figure 15:
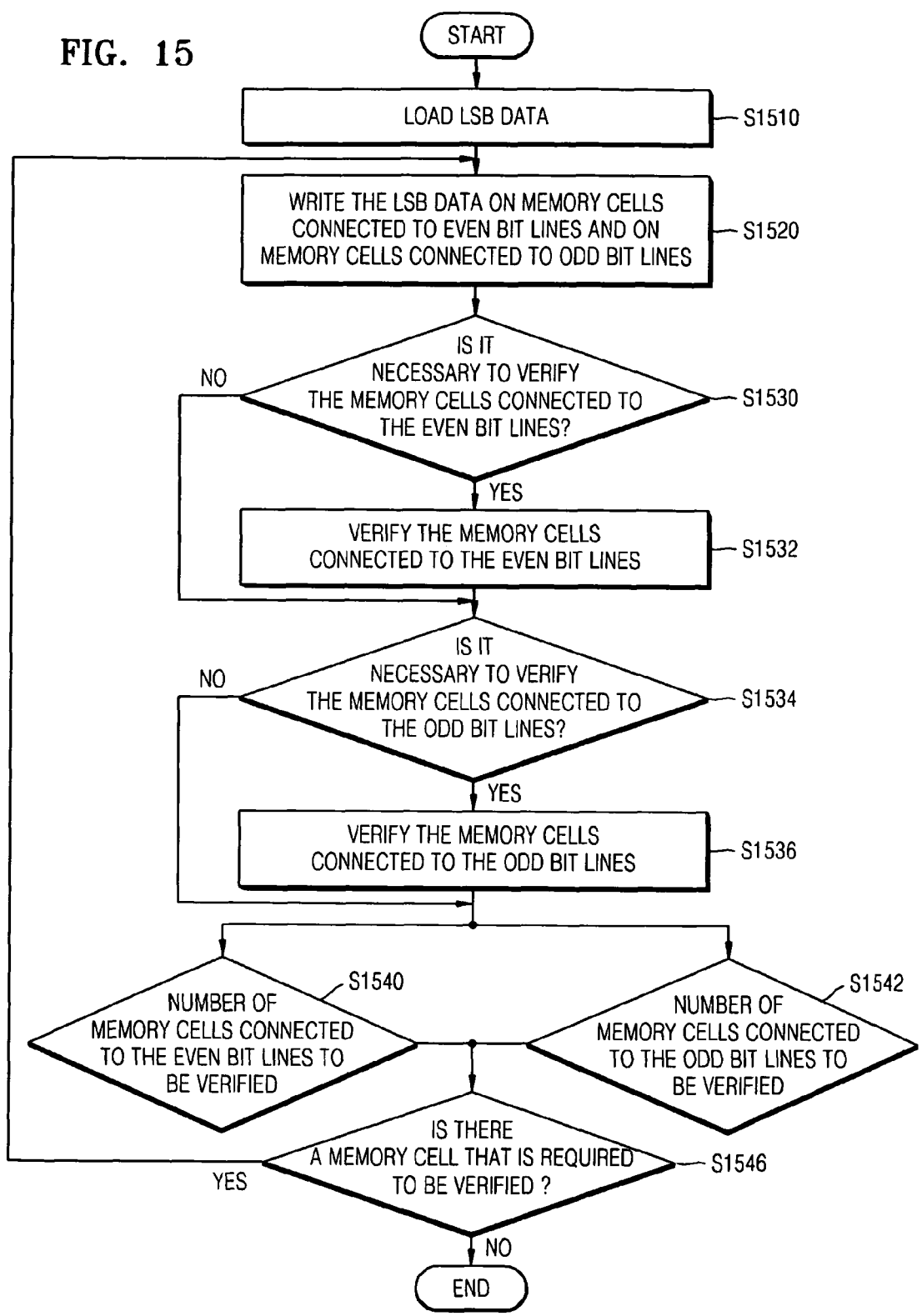
FIG. 15 illustrates a flowchart of the method of programming/verifying memory cell data according to the third embodiment of the present invention.

FIG. 15 illustrates a flowchart of the method of programming/verifying memory cell data according to the third embodiment of the present invention.

The method of programming/verifying memory cell data according to the third embodiment of the present invention loads LSB data (operation S1510), and then simultaneously writes the LSB data to memory cells connected to even bit lines and to memory cells connected to odd bit lines (operation S1520).

After the LSB data is written, whether memory cells connected to the even bit lines and memory cells connected to the odd bit lines are respectively required to be verified may be determined (operations S1530 and S1534). If required, the memory cells connected to one of the even and odd bit lines are respectively verified (operations S1532 and S1536).

After that, whether there are memory cells which require verification may be determined again (operations S1540 and S1542). If it is determined that there are memory cells which require verification (operation S1546), the operation of writing the LSB data (that is, operation S1520) and operations thereafter may be performed again.

Figure 16:
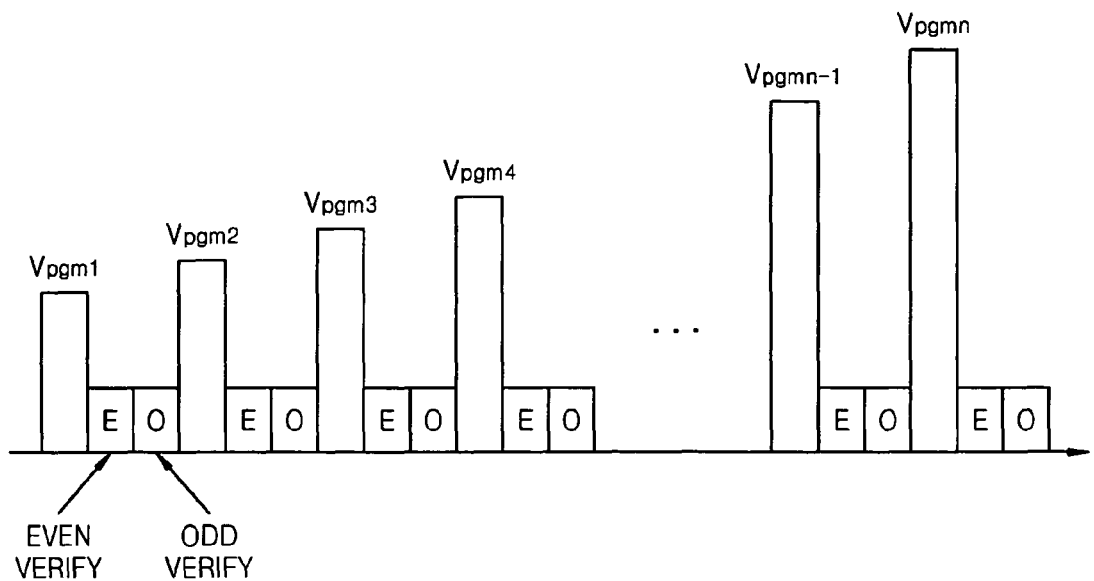
FIG. 16 illustrates a diagram of a third comparative method of programming/verifying memory cell data.

FIG. 16 illustrates a diagram describing a third comparative method of programming/verifying memory cell data. Referring to FIG. 16, the third comparative method of programming/verifying memory cell data performs the verification in all verification periods (E and O periods) after every time the programming voltage is applied. Thus, as compared to the third comparative method of programming/verifying memory cell data as described in FIG. 16, the method of programming/verifying memory cell data according to the third embodiment of the present invention may reduce a verification time.

Figure 17:
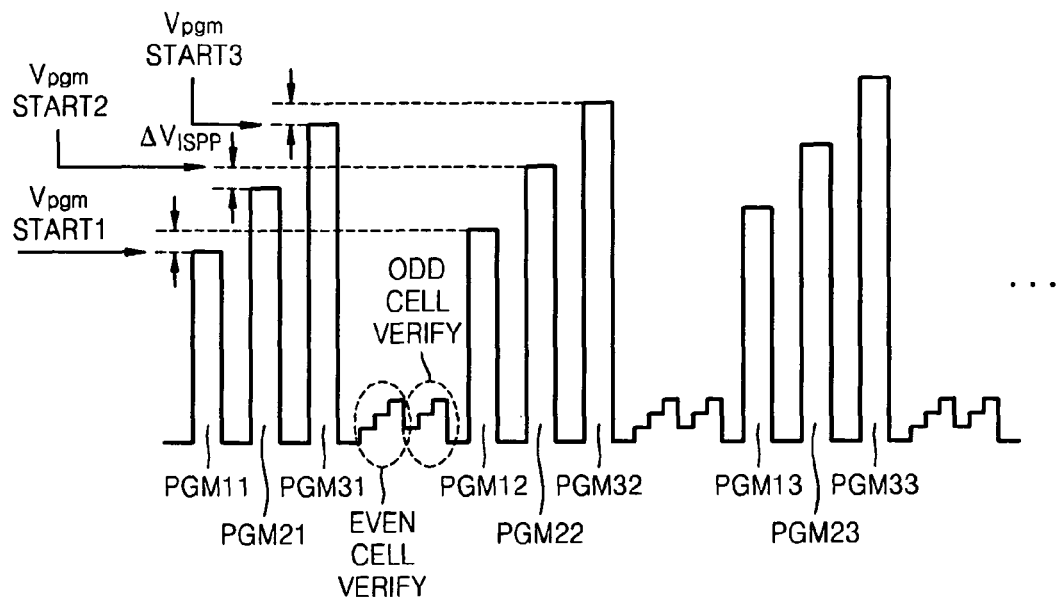
FIG. 17 illustrates a method of programming/verifying memory cell data according to a fourth embodiment of the present invention.

FIG. 17 illustrates a diagram for describing a method of programming/verifying memory cell data according to a fourth embodiment of the present invention. The method of programming/verifying memory cell data according to the fourth embodiment of the present invention may include first through $n_{th}$ (n is a natural number greater than 2) programming stages, a first verification stage (an EVEN CELL VERIFY period in FIG. 17), and a second verification stage (an ODD CELL VERIFY period in FIG. 17).

Hereinafter, the method of programming/verifying memory cell data according to the fourth embodiment of the present invention will be described for first through third programming stages, i.e., n is 3. However, the number of programming stages is not limited to three stages. Also, hereinafter, a programming voltage will be described as being applied as a voltage pulse.

The first through third programming stages may program a memory cell using first through third programming voltages Vpgm_start1, Vpgm_start2, and Vpgm-start3. The first through third programming voltages Vpgm_start1, Vpgm_start2, and Vpgm-start3 may be used to change a threshold voltage of the memory cell so as to write a predetermined value to the memory cell. A range of variations of the threshold voltage, which is changed by the first through third programming voltages Vpgm_start1, Vpgm_start2, and Vpgm-start3, may be differentiated. Thus, programmed data values may be different from each other.

Figure 18A:
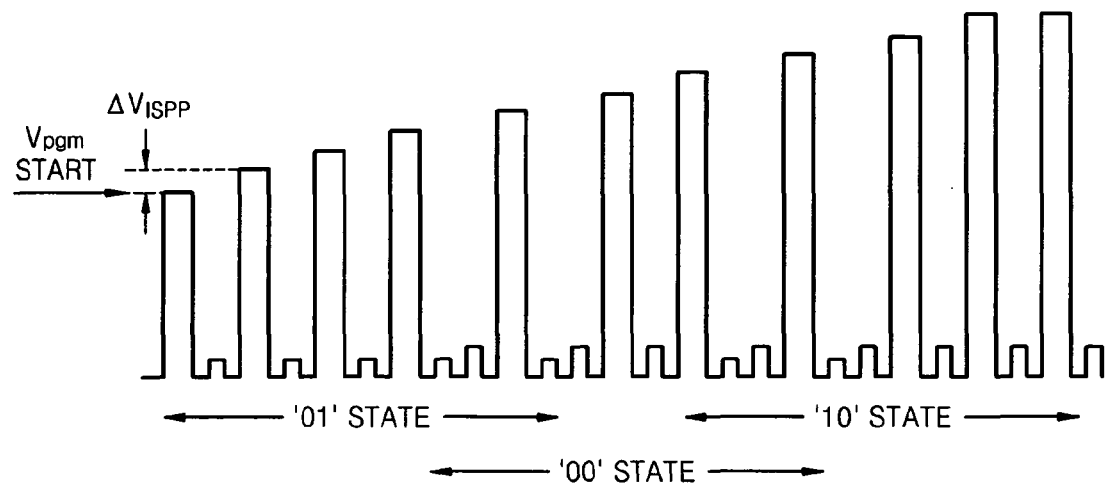
FIGS. 18A, 18B, and 18C illustrate a fourth comparative method of programming/verifying memory cell data.
Figure 18B:
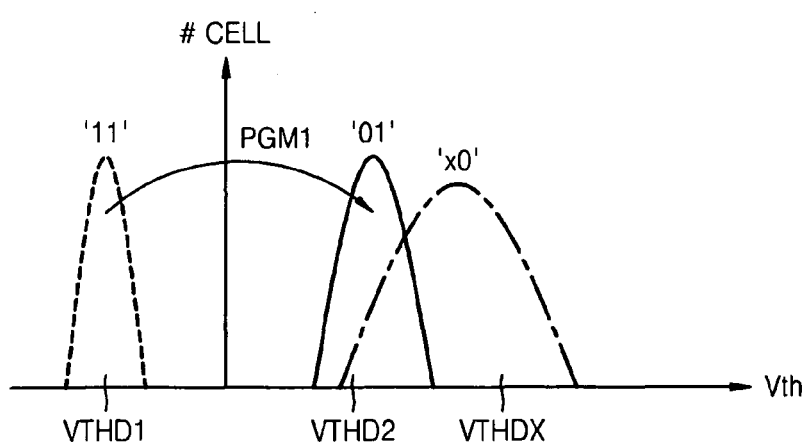

For example, the first programming stage may correspond to a programming stage PGM1 of FIG. 18B in which the memory cell is programmed so as to shift between a first threshold voltage distribution VTHD1 and a second threshold voltage distribution VTHD2. Also, if the second threshold voltage distribution VTHD2 is assumed to correspond to '01', a programming pulse PGM11 applied in the first programming stage is a programming pulse for programming '01' on the memory cell.

Figure 18C:
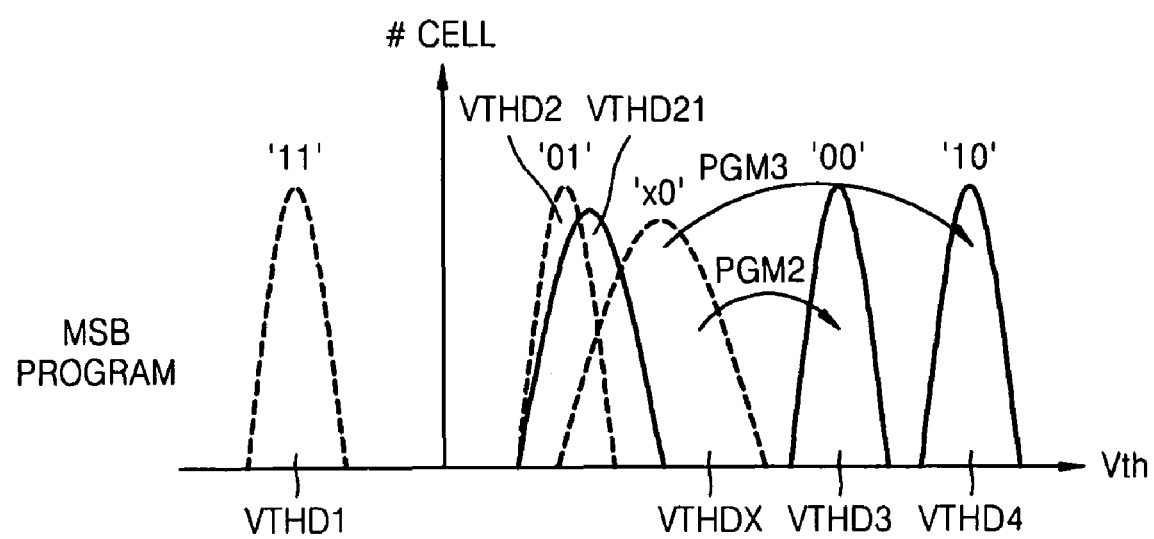

The second programming stage may correspond to a programming stage PGM2 of FIG. 18C in which the memory cell is programmed so as to shift between an intermediate threshold voltage distribution VTHDX and a third threshold voltage distribution VTHD3. If the third threshold voltage distribution VTHD3 is assumed to correspond to '00', a programming pulse PGM21 applied in the second programming stage is a programming pulse for programming '00' on the memory cell.

The third programming stage may correspond to a programming stage PGM3 of FIG. 18C in which the memory cell is programmed so as to shift between the intermediate threshold voltage distribution VTHDX and a fourth threshold voltage distribution VTHD4. If the fourth threshold voltage distribution VTHD4 is assumed to correspond to '10', a programming pulse PGM31 applied in the third programming stage is a programming pulse for programming '10' on the memory cell.

When a programming pulse is applied to a target programming memory cell, a non-target programming memory cell may be set to be a programming prohibited memory cell. Thus, a programming prohibition voltage, rather than the programming pulse, may be applied to the programming prohibited memory cell.

A correspondence relationship between such a programming pulse and the data value may differ depending on a correspondence relationship between the threshold voltage distributions and the data value. For example, if the first through fourth threshold voltage distributions are assumed to respectively correspond to '11', '10', '00', and '01', the programming pulse PGM11 applied in the first programming stage may be a programming pulse for programming '10' on the memory cell, and the programming pulse PGM31 applied in the third programming stage may be a programming pulse for programming '01' on the memory cell.

The method of programming/verifying memory cell data according to the fourth embodiment of the present invention may apply the programming pulses PGM11, PGM21, and PGM31, and then may verify memory cells connected to even bit lines and memory cells connected to odd bit lines.

In the first verification stage (the EVEN CELL VERIFY period in FIG. 17), data written to memory cells connected to bit lines, corresponding to a first bit line group, may be verified using a varying verification voltage. In the second verification stage (the ODD CELL VERIFY period in FIG. 17), data written to the memory cells connected to bit lines corresponding to a second bit line group may be verified using the varying verification voltage. After the second verification stage (the ODD CELL VERIFY period in FIG. 17), the method of programming/verifying memory cell data according to the fourth embodiment of the present invention may perform the first through $n_{th}$ programming stages again by gradually increasing the programming voltages PGM11, PGM21, and PGM31.

Referring to FIG. 17, a programming pulse PGM12 of the first programming stage, which is secondly performed, may have a voltage higher than the programming pulse PGM11 of the first programming stage, which is firstly performed, by as much as a predetermined voltage $\Delta V_{ISPP}$. That is, a voltage of the programming pulse PGM11 of the first programming stage, which is firstly performed, may be Vpgm_start1, and a voltage of the programming pulse PGM12 of the first programming stage, which is secondly performed, may be Vpgm_start1+$\Delta V_{ISPP}$.

Similarly, each of a programming pulse PGM22 of the second programming stage, which is secondly performed, and a programming pulse PGM32 of the third programming stage, which is secondly performed, may have a voltage higher than the programming pulse PGM21 of the second programming stage, which is firstly performed, and the programming pulse PGM31 of the third programming stage, which is firstly performed, by as much as the predetermined voltage $\Delta V_{ISPP}$. That is, a voltage of the programming pulse PGM21 of the second programming stage, which is firstly performed, may be Vpgm_start2, and a voltage of the programming pulse PGM22 of the second programming stage, which is secondly performed, may be Vpgm_start2+$\Delta V_{ISPP}$. Also, a voltage of the programming pulse PGM31 of the third programming stage, which is firstly performed, may be Vpgm_start3, and a voltage of the programming pulse PGM32 of the third programming stage, which is secondly performed, may be Vpgm_start3+$\Delta V_{ISPP}$.

In this manner, the first through third programming stages may be repeatedly performed until the programming of the memory cell is finished.

FIG. 18A illustrates a diagram for describing a fourth comparative method of programming/verifying memory cell data. Referring to FIGS. 17 and 18A, the method of programming/verifying memory cell data according to the fourth embodiment of the present invention is compared to the fourth comparative method of programming/verifying memory cell data as described in FIG. 18A.

Referring to FIG. 18A, the fourth comparative method of programming/verifying memory cell data as described in FIG. 18A sequentially applies programming pulses (pulses in a '01' STATE period) for writing '01', thereby completing the programming of '01'. In this manner, the other method of programming/verifying memory cell data as described in FIG. 18A sequentially applies programming pulses (pulses in a '00' STATE period) for writing '00', thereby completing the programming of '00', and applies programming pulses (pulses in a '10' STATE period) for writing '01', thereby completing the programming of '10'. Also, after each of the programming pulses is applied, each of the programming with respect to each of the applied programming pulses is verified.

However, in the fourth comparative method of FIG. 18A, a threshold voltage distribution of a memory cell programmed in a previous programming stage is changed during when a specific programming stage is performed. For example, after the programming of '01' is completed by applying the programming pulses (the pulses in the '01' STATE period), which are for writing '01', to first memory cells, when the programming pulses (the pulses in the '10' STATE period) for writing '10' are applied to second memory cells, the threshold voltage distributions of first memory cells from among the first memory cells that are close to the second memory cells may be shifted from by the programming pulses (the pulses in the '10' STATE period) applied to the second memory cells for the programming of '10'. Also, when '10' is programmed on the second memory cells, the programming of the first memory cells has been completed. Thus, there is no opportunity to adjust the threshold voltage distributions of the shifted first memory cells.

FIG. 18C corresponds to the case in which the threshold voltage distribution of the memory cell programmed in the first programming stage PGM1 is shifted from VTHD2 to VTHD21 during when the third programming stage PGM3 is performed.

On the other hand, the method of programming/verifying memory cell data according to the fourth embodiment of the present invention does not apply all of the programming pulses PGM11, PGM12, and PGM13 for writing '01', and does not apply all of the programming pulses PGM21, PGM22, and PGM23 for writing '00'. Instead, after the programming pulse PGM11 for writing '01' is applied, the programming pulse PGM21 for writing '00' is applied. Next, after the programming pulse PGM12 for writing '01' is applied, the programming pulse PGM22 for writing '00' is applied. By doing so, the method of programming/verifying memory cell data according to the fourth embodiment of the present invention may prevent the threshold voltage distribution of the memory cell from being altered, while such alteration occurs in the fourth comparative method of programming/verifying memory cell data described in FIG. 18A.

Methods of programming/verifying memory cell data according to embodiments described above may be used to read the data written to the memory cell. Also, methods of programming/verifying memory cell data according to embodiments described above may be used as a part of a memory cell programming method.

The memory cell, to which embodiments maybe applied, may be a multi-level flash memory cell in which n bit data is stored. Also, the memory cell may be a NAND flash memory cell in which the n bit data is stored. A threshold voltage of the memory cell may correspond to one of 2n pieces of threshold voltage distributions.

As described above, methods of programming/verifying or reading memory cell data according to embodiments may reduce a programming time and decrease a coupling. Also, methods of programming/verifying or reading memory cell data according to embodiments may reduce a data verification time.

Exemplary embodiments of the present invention have been disclosed herein, and although specific terms are employed, they are used and are to be interpreted in a generic and descriptive sense only and not for purpose of limitation.

As used in connection with the following claims, "controlling" may include verifying and reading. Accordingly, it will be understood by those of ordinary skill in the art that various changes in form and details may be made without departing from the spirit and scope of the present invention as set forth in the following claims.

What is claimed is:

1. A method of operating non-volatile memory device, the method comprising:
    simultaneously programming non-volatile memory cells connected to bit lines corresponding to a first bit line group and a second bit line group using a programming voltage;
    performing a first verify operation to the non-volatile memory cells connected to the bit lines corresponding to the first bit line group by varying a verification voltage after the programming operation; and
    performing a second verify operation to the non-volatile memory cells connected to the bit lines corresponding to the second bit line group by varying a verification voltage after the first verify operation.

2. The method as claimed in claim 1, wherein the programming comprises simultaneously programming data to a plurality of the non-volatile memory cells connected to a same word line.

3. The method as claimed in claim 1, wherein the first bit line group includes even bit lines and the second bit line group includes odd bit lines, or the first bit line group includes the odd bit lines and the second bit line group includes the even bit lines.

4. The method as claimed in claim 1, wherein the verification voltage is a word line voltage.

5. The method as claimed in claim 1, wherein:
    the first verifying includes verifying data written to the non-volatile memory cells using a first verification voltage, with a word line set to the first verification voltage, the word line being connected to the non-volatile memory cells,
    the second verifying includes verifying data written to the non-volatile memory cells using a second verification voltage, with a word line set to the second verification voltage, the word line being connected to the non-volatile memory cells, and
    the second verification voltage is higher than the first verification voltage.

6. The method as claimed in claim 1, wherein the non-volatile memory cell is a multi-level flash memory cell in which n (n is a natural number equal to or greater than 2) bit data is stored.

7. The method as claimed in claim 1, further comprising:
    dividing a plurality of bit lines into N (N is a natural number greater than 2) bit line groups;
    ith verifying the data written to the non-volatile memory cells connected to bit lines corresponding to the ith (i is the natural number greater than 1 and less than N-1) bit line group by varying a verification voltage; and
    Nth verifying data written to the non-volatile memory cells connected to bit lines corresponding to the N-th bit line group by varying a verification voltage.

8. The method as claimed in claim 7, wherein the dividing includes assigning adjacent bit lines to different bit line groups.

9. A method of operating non-volatile memory device, the method comprising:
    simultaneously programming non-volatile memory cells connected to bit lines corresponding to a first bit line group and a second bit line group using a programming voltage, the non-volatile memory cells being multi-level cells including a first program state and a second program state;
    performing a determination operation whether the non-volatile memory cells connected to the bit lines are required to be verified; and
    performing, upon the determination, at least one of a first verification operation to the non-volatile memory cells using a first verification voltage for verifying the first program state and a second verification operation to the non-volatile memory cells using a second verification voltage for verifying the second program state,
    wherein the determination operation includes a first determination for the first verification operation to the non-volatile memory cells connected to the bit lines corresponding to the first bit line group, a second determination for the second verification operation to the non-volatile memory cells connected to the bit lines corresponding to the first bit line group, a third determination for the first verification operation to the non-volatile memory cells connected to the bit lines corresponding to the second bit line group and a fourth determination for the second verification operation to the non-volatile memory cells connected to the bit lines corresponding to the second bit line group.

10. The method as claimed in claim 9, wherein the determination operation performs the first through fourth determinations separately.

11. The method as claimed in claim 9, wherein the determination operation performs the first and the third determinations simultaneously.

12. The method as claimed in claim 9, wherein the determination operation performs the second and the fourth determinations simultaneously.

13. The method as claimed in claim 9, wherein the determination operation determines whether the first verification operation is not required based on a result of at least one of the first determination and the third determination.

14. The method as claimed in claim 9, wherein the determination operation determines whether the second verification operation is not required based on a result of at least one of the second determination and the fourth determination.

15. The method as claimed in claim 9, wherein at least one of the first and second verifications is skipped upon the determination.

16. The method as claimed in claim 9, wherein all the first and second verifications are performed after a current programming, and at least one of the first and second verifications is skipped according to the determination after a next programming.

17. A method of operating non-volatile memory device, the method comprising:
    simultaneously programming non-volatile memory cells connected to bit lines corresponding to a first bit line group and a second bit line group using a programming voltage, the non-volatile memory cells being multi-level cells including at least two program states; and
    performing a verification operation to the non-volatile memory cells using a first verification voltage and a second verification voltage after the programming operation,
    wherein the verification operation comprises a first verification operation corresponding to the first bit line group and a second verification operation corresponding to the second bit line group, each of the first and second verification operation including a first period using the first verification voltage and a second period using the second verification voltage, wherein, when a verification of the first period of the first verification operation is finished during a current verification operation, the first period of the first verification operation is skipped during a next verification operation.

18. The method as claimed in claim 17, wherein the verification of the first period of the first verification operation is finished when a result of the verification is a pass.

19. The method as claimed in claim 17, wherein when a verification of the second period of the first verification operation is also finished during a current verification operation, the second period of the first verification operation is also skipped during a next verification operation.

20. A method of operating non-volatile memory device, the method comprising:

simultaneously programming non-volatile memory cells connected to bit lines corresponding to a first bit line group and a second bit line group using a programming voltage, the non-volatile memory cells being multi-level cells including at least two program states including a first program state and a second program state; and performing a verification operation to the non-volatile memory cells using a first verification voltage for verifying the first program state and a second verification voltage for verifying the second program state after the programming operation, wherein the verification operation comprises a first verification operation corresponding to the first bit line group and a second verification operation corresponding to the second bit line group, each of the first and second verification operation including a first period using the first verification voltage and a second period using the second verification voltage, wherein the first verification voltage is lower than the second verification voltage, wherein, when the second period of the first verification operation is finished and the second period of the second verification operation is not finished during a current verification operation, the second verification voltage is not applied to the non-volatile memory cells connected to bit lines corresponding to the first bit line group during a next verification operation.

21. The method as claimed in claim 20, wherein the second verification voltage is applied to the non-volatile memory cells connected to bit lines corresponding to the second bit line group during the next verification operation.

* * * * *